United States Patent
Saito et al.

(10) Patent No.: US 10,650,849 B2
(45) Date of Patent: *May 12, 2020

(54) MAGNETORESISTIVE ELEMENT HAVING EXCHANGE-COUPLED FILM INCLUDING PTCR/XMN ANTIFERROMAGNETIC BILAYER

(71) Applicant: ALPS ALPINE CO., LTD., Ota-ku, Tokyo (JP)

(72) Inventors: Masamichi Saito, Niigata-ken (JP); Fumihito Koike, Niigata-ken (JP); Hiroaki Endo, Niigata-ken (JP)

(73) Assignee: ALPS ALPINE CO., LTD., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/271,933

(22) Filed: Feb. 11, 2019

(65) Prior Publication Data

US 2019/0189150 A1    Jun. 20, 2019

Related U.S. Application Data

(63) Continuation of application No. PCT/JP2017/027960, filed on Aug. 2, 2017.

(30) Foreign Application Priority Data

Aug. 10, 2016  (JP) .................. 2016-157441

(51) Int. Cl.
*G11B 5/39* (2006.01)
*H01L 43/12* (2006.01)
(Continued)

(52) U.S. Cl.
CPC ............ *G11B 5/3906* (2013.01); *G01R 33/09* (2013.01); *G11B 5/3945* (2013.01); *H01F 10/12* (2013.01);
(Continued)

(58) Field of Classification Search
None
See application file for complete search history.

(56) References Cited

U.S. PATENT DOCUMENTS

| | | | |
|---|---|---|---|
| 2001/0017543 A1* | 8/2001 | Daughton et al. ... | G11B 5/3903 324/252 |
| 2019/0170835 A1* | 6/2019 | Endo et al. .......... | G11B 5/3906 |

FOREIGN PATENT DOCUMENTS

| | | |
|---|---|---|
| JP | 2000-215431 | 8/2000 |
| JP | 2001-134910 | 5/2001 |

(Continued)

OTHER PUBLICATIONS

International Search Report issued in PCT/JP2017/027960, dated Sep. 19, 2017.

*Primary Examiner* — Craig A. Renner
(74) *Attorney, Agent, or Firm* — Hunton Andrews Kurth LLP

(57) ABSTRACT

An exchange-coupled film according to the present invention includes an antiferromagnetic layer, pinned magnetic layer, and free magnetic layer which are stacked. The antiferromagnetic layer is composed of a Pt—Cr sublayer and an X—Mn sublayer (where X is Pt or Ir). The X—Mn sublayer is in contact with the pinned magnetic layer. The Pt—Cr sublayer has a composition represented by the formula $Pt_\alpha Cr_{100 \ at\ \%-\alpha}$ ($\alpha$ is 44 at % to 58 at %) when the X—Mn sublayer is placed on the Pt—Cr sublayer or has a composition represented by the formula $Pt_\alpha Cr_{100 \ at\ \%-\alpha}$ ($\alpha$ is 44 at % to 57 at %) when the X—Mn sublayer is placed on the pinned magnetic layer.

11 Claims, 13 Drawing Sheets

(51) Int. Cl.
*H01L 43/08* (2006.01)
*G01R 33/09* (2006.01)
*H01F 10/12* (2006.01)
*H01L 43/10* (2006.01)

(52) U.S. Cl.
CPC .............. *H01L 43/08* (2013.01); *H01L 43/10* (2013.01); *H01L 43/12* (2013.01); *G11B 2005/3996* (2013.01)

(56) References Cited

FOREIGN PATENT DOCUMENTS

| | | |
|---|---|---|
| JP | 2002-314169 | 10/2002 |
| JP | 2011-119755 | 6/2011 |

\* cited by examiner

MAGNETORESISTIVE ELEMENT HAVING EXCHANGE-COUPLED FILM INCLUDING PTCR/XMN ANTIFERROMAGNETIC BILAYER

CLAIM OF PRIORITY

This application is a Continuation of International Application No. PCT/JP2017/027960 filed on Aug. 2, 2017, which claims benefit of Japanese Patent Application No. 2016-157441 filed on Aug. 10, 2016. The entire contents of each application noted above are hereby incorporated by reference.

BACKGROUND OF THE INVENTION

1. Field of the Invention

The present invention relates to an exchange-coupled film, a magnetoresistive element including the same, and a magnetic sensing device.

2. Description of the Related Art

Exchange-coupled films including an antiferromagnetic layer and a pinned magnetic layer are used as magnetoresistive elements or magnetic sensing devices. Japanese Unexamined Patent Application Publication No. 2000-215431 (hereinafter referred to as the patent document) describes that in a magnetic recording medium, an exchange-coupled film can be configured by combining a Co alloy serving as a ferromagnetic film with various alloys serving as antiferromagnetic films. As antiferromagnetic films, alloys such as Co—Mn, Ni—Mn, Pt—Mn, and Pt—Cr are exemplified.

A magnetic sensing device requires solder reflowing (melting) when a magnetoresistive element is mounted on a board. The magnetic sensing device is used in a high-temperature environment such as the vicinity of an engine in some cases. Therefore, an exchange-coupled film for use in the magnetic sensing device preferably exhibits such a high magnetic field (Hex) that the magnetization direction of a pinned magnetic layer is reversed and also exhibits high stability under high-temperature conditions for the purpose of enabling a magnetic field to be detected in a wide dynamic range.

The patent document relates to an exchange-coupled film used as a magnetic recording medium and therefore does not describe the stability of a magnetic sensing device including an exchange-coupled film under high-temperature conditions. Although the patent document exemplifies Pt—Cr as an antiferromagnetic film, the patent document does not describe that composing Pt—Cr at what composition ratio is preferable.

SUMMARY OF THE INVENTION

The present invention provides an exchange-coupled film which exhibits such a high magnetic field (Hex) that the magnetization direction of a pinned magnetic layer is reversed and which exhibits high stability under high-temperature conditions, a magnetoresistive element including the same, and a magnetic sensing device.

An exchange-coupled film according to the present invention includes an antiferromagnetic layer and pinned magnetic layer which are stacked. The antiferromagnetic layer is composed of a Pt—Cr sublayer and X—Mn sublayer (where, X is Pt or Ir). The X—Mn sublayer is in contact with the pinned magnetic layer. In the exchange-coupled film, the Pt—Cr sublayer has a composition represented by the formula $Pt_\alpha Cr_{100\ at\ \%-\alpha}$ ($\alpha$ is 44 at % to 58 at %) when the X—Mn sublayer is placed on the Pt—Cr sublayer or has a composition represented by the formula $Pt_\alpha Cr_{100\ at\ \%-\alpha}$ ($\alpha$ is 44 at % to 57 at %) when the X—Mn sublayer is placed on the pinned magnetic layer.

The pinned magnetic layer may be a self-pinned layer including a first magnetic sublayer, intermediate sublayer, and second magnetic sublayer which are stacked.

The thickness of the Pt—Cr sublayer is preferably greater than the thickness of the X—Mn sublayer.

The ratio of the thickness of the Pt—Cr sublayer to the thickness of the X—Mn sublayer is preferably 5:1 to 100:1.

The Pt—Cr sublayer preferably has a composition represented by the formula $Pt_\alpha Cr_{100\ at\ \%-\alpha}$ ($\alpha$ is 45 at % to 57 at %) in some cases, more preferably a composition represented by the formula $Pt_\alpha Cr_{100\ at\ \%-\alpha}$ ($\alpha$ is 48 at % to 55 at %) in some cases, and particularly preferably a composition represented by the formula $Pt_\alpha Cr_{100\ at\ \%-\alpha}$ ($\alpha$ is 49 at % to 53.5 at %) in some cases when the X—Mn sublayer is placed on the Pt—Cr sublayer. The Pt—Cr sublayer preferably has a composition represented by the formula $Pt_\alpha Cr_{100\ at\ \%-\alpha}$ ($\alpha$ is 45 at % to 56 at %), more preferably a composition represented by the formula $Pt_\alpha Cr_{100\ at\ \%-\alpha}$ ($\alpha$ is 47 at % to 55 at %) in some cases, and particularly preferably a composition represented by the formula $Pt_\alpha Cr_{100\ at\ \%-\alpha}$ ($\alpha$ is 48 at % to 53.5 at %) in some cases when the X—Mn sublayer is placed on the pinned magnetic layer.

The exchange-coupled film preferably includes a base layer next to the antiferromagnetic layer. The base layer is preferably made of Ni—Fe—Cr.

A magnetoresistive element according to the present invention includes the exchange-coupled film according to the present invention and a free magnetic layer, the exchange-coupled film and the free magnetic layer being stacked.

A magnetic sensing device according to the present invention includes the magnetoresistive element according to the present invention.

The magnetic sensing device according the present invention includes a plurality of magnetoresistive elements, placed on a single substrate, identical to the magnetoresistive element according to the present invention. The magnetoresistive elements include those having different pinned magnetization directions.

A method for manufacturing an exchange-coupled film according to the present invention, the exchange-coupled film including an antiferromagnetic layer and pinned magnetic layer which are stacked, the antiferromagnetic layer being composed of a Pt—Cr sublayer and an X—Mn sublayer (where X is Pt or Ir), the X—Mn sublayer being in contact with the pinned magnetic layer, includes forming the Pt—Cr sublayer such that the Pt—Cr sublayer has a composition represented by the formula $Pt_\alpha Cr_{100\ at\ \%-\alpha}$ ($\alpha$ is 44 at % to 58 at %) in the case where the X—Mn sublayer is stacked on the Pt—Cr sublayer or forming the Pt—Cr sublayer such that the Pt—Cr sublayer has a composition represented by the formula $Pt_\alpha Cr_{100\ at\ \%-\alpha}$ ($\alpha$ is 44 at % to 57 at %) in the case where the X—Mn sublayer is stacked on the pinned magnetic layer.

An exchange-coupled film according to the present invention includes an antiferromagnetic layer composed of a Pt—Cr sublayer and an X—Mn sublayer (where X is Pt or Ir) and therefore exhibits such a high magnetic field (Hex) that the magnetization direction of a pinned magnetic layer is reversed is high and increased stability under high-temperature conditions. Thus, using the exchange-coupled film according to the present invention enables a magnetic sensing device which is stable even if the magnetic sensing device is reflowed at high temperature or is used in a high-temperature environment to be obtained. In the exchange-coupled film according to the present invention, the composition range of the Pt—Cr sublayer is different between the case where the X—Mn sublayer is placed on the Pt—Cr sublayer and the case where the X—Mn sublayer is placed on the pinned magnetic layer; hence, the intensity of an exchange coupling field induced due to the Pt—Cr sublayer can be stably increased.

In accordance with a manufacturing method according to the present invention, an exchange-coupled film including a pinned magnetic layer with high Hex can be manufactured in such a manner that the composition range of the Pt—Cr sublayer is different between the case where the X—Mn sublayer is placed on the Pt—Cr sublayer and the case where the X—Mn sublayer is placed on the pinned magnetic layer.

DESCRIPTION OF THE PREFERRED EMBODIMENTS

First Embodiment

Figure 1:
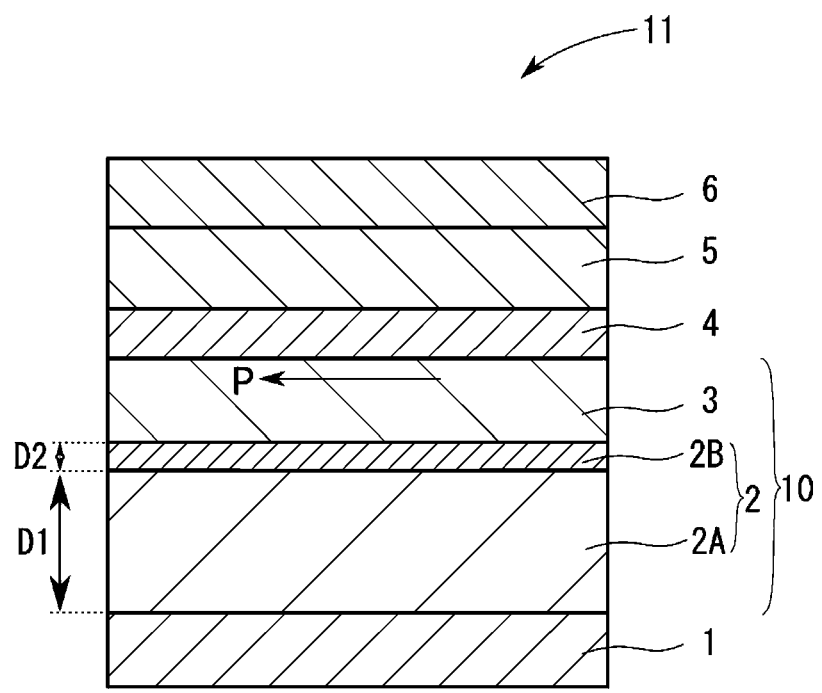
FIG. 1 is an illustration showing the film configuration of an exchange-coupled film according to a first embodiment of the present invention.

FIG. 1 shows the film configuration of a magnetic sensing element 11 including an exchange-coupled film 10 according to a first embodiment of the present invention.

The magnetic sensing element 11 is formed by stacking a base layer 1, an antiferromagnetic layer 2, a pinned magnetic layer 3, a nonmagnetic material layer 4, a free magnetic layer 5, and a protective layer 6 in that order from a surface of a substrate. The antiferromagnetic layer 2 is composed of a Pt—Cr sublayer 2A and an X—Mn sublayer 2B (where, X is Pt or Ir). The X—Mn sublayer 2B is in contact with the pinned magnetic layer 3. These layers are formed by, for example, a sputtering process or a CVD process. The base layer 1 and the pinned magnetic layer 3 form the exchange-coupled film 10.

The magnetic sensing element 11 is a multilayer element using a so-called single spin valve type of giant magnetoresistive effect (GMR effect) and the electrical resistance thereof varies depending on the relative relation between the vector of the pinned magnetization of the pinned magnetic layer 3 and the vector of magnetization that varies depending on the external magnetic field of the free magnetic layer 5.

The base layer 1 is formed from a Ni—Fe—Cr alloy (nickel-iron-chromium alloy), Cr, Ta, or the like. In the exchange-coupled film 10, the Ni—Fe—Cr alloy is preferable for the purpose of increasing the magnetic field (hereinafter also appropriately referred to as the "Hex") at which the magnetization of the pinned magnetic layer 3 is reversed.

The antiferromagnetic layer 2 has a multilayer structure composed of the Pt—Cr sublayer 2A and the X—Mn sublayer 2B (where, X is Pt or Ir). In order to increase the Hex, the thickness D1 of the Pt—Cr sublayer 2A is preferably greater than the thickness D2 of the X—Mn sublayer 2B. The ratio of the thickness D1 to the thickness D2 (D1:D2) is preferably 5:1 to 100:1 and more preferably 10:1 to 50:1.

From the viewpoint of increasing the Hex, the Pt—Cr sublayer 2A preferably has a composition represented by the formula $Pt_\alpha Cr_{100\ at\ \%-\alpha}$ ($\alpha$ is 45 at % to 62 at %) and more preferably a composition represented by the formula $Pt_\alpha Cr_{100\ at\ \%-\alpha}$ ($\alpha$ is 50 at % to 57 at %). From the same viewpoint, the X—Mn sublayer 2B is preferably a Pt—Mn sublayer.

In this embodiment, the antiferromagnetic layer 2 is regularized by annealing, whereby exchange coupling is induced between (at the interface between) the antiferromagnetic layer 2 and the pinned magnetic layer 3. The exchange coupling increases the strong-magnetic field resistance of the pinned magnetic layer 3 to increase the Hex.

The pinned magnetic layer 3 is formed from a Co—Fe alloy (cobalt-iron alloy). Increasing the content of Fe in the Co—Fe alloy increases the coercive force thereof. The pinned magnetic layer 3 is a layer contributing to the spin valve type of giant magnetoresistive effect. A direction in which the pinned magnetization direction P of the pinned magnetic layer 3 extends is the sensitivity axis direction of the magnetic sensing element 11.

The nonmagnetic material layer 4 can be formed using Cu (copper) or the like.

The free magnetic layer 5 is not limited in material or structure. The free magnetic layer 5 can be formed using, for example, material such as a Co—Fe alloy (cobalt-iron alloy) or a Ni—Fe alloy (nickel-iron alloy) in the form of a single-layer structure, a multilayer structure, or a multilayered ferrimagnetic structure.

The protective layer 6 can be formed using Ta (tantalum).

Second Embodiment

Figure 2:
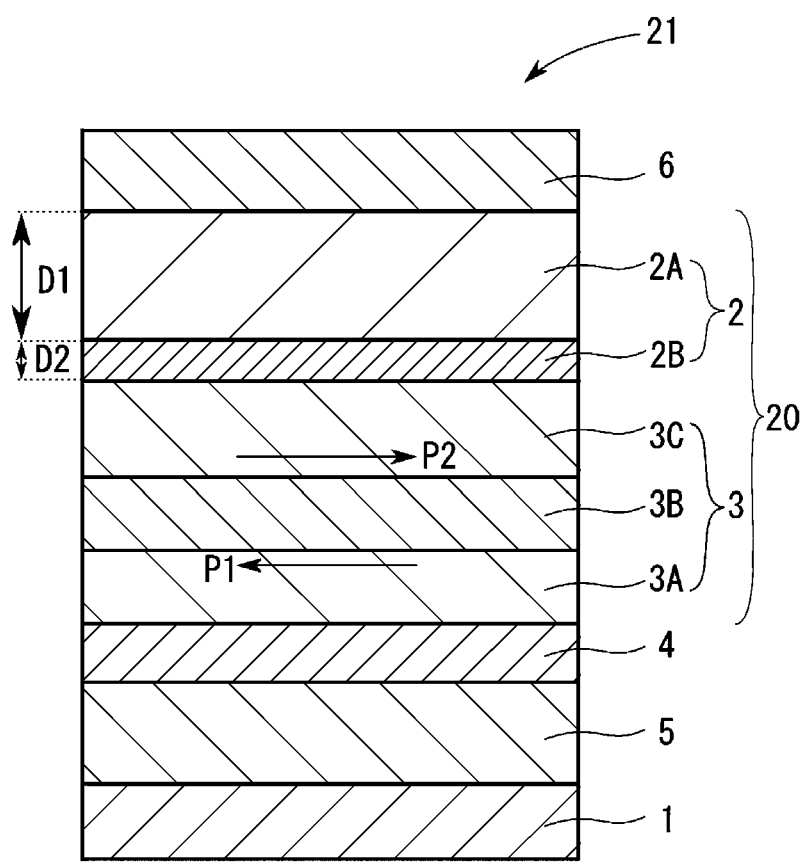
FIG. 2 is an illustration showing the film configuration of an exchange-coupled film according to a second embodiment of the present invention.

FIG. 2 is an illustration showing the film configuration of a magnetic sensing element 21 including an exchange-coupled film 20 according to a second embodiment of the present invention. In this embodiment, layers having the same function as that of the magnetic sensing element 11 shown in FIG. 1 are given the same reference numerals and will not be described in detail.

In the magnetic sensing element 21, the exchange-coupled film 20 is composed of a pinned magnetic layer 3 with a self-pinned structure and an antiferromagnetic layer 2 joined thereto. The magnetic sensing element 21 differs from the magnetic sensing element 11 shown in FIG. 1 in that a nonmagnetic material layer 4 and a free magnetic layer 5 are placed under the pinned magnetic layer 3.

The magnetic sensing element 21 is also a multilayer element using a so-called single spin valve type of giant magnetoresistive effect. The electrical resistance thereof varies depending on the relative relation between the vector of the pinned magnetization of a first magnetic sublayer 3A of the pinned magnetic layer 3 and the vector of magnetization that varies depending on the external magnetic field of the free magnetic layer 5.

The pinned magnetic layer 3 has a self-pinned structure composed of the first magnetic sublayer 3A, a second magnetic sublayer 3C, and a nonmagnetic intermediate sublayer 3B located between these two sublayers. The pinned magnetization direction P1 of the first magnetic sublayer 3A is antiparallel to the pinned magnetization direction P2 of the second magnetic sublayer 3C because of interaction. The first magnetic sublayer 3A is next to the nonmagnetic material layer 4 and the pinned magnetization direction P1 of the first magnetic sublayer 3A is the pinned magnetization direction of the pinned magnetic layer 3. A direction in which the pinned magnetization direction P1 extends is the sensitivity axis direction of the magnetic sensing element 21.

The first magnetic sublayer 3A and the second magnetic sublayer 3C are formed from a Co—Fe alloy (cobalt-iron alloy). Increasing the content of Fe in the Co—Fe alloy increases the coercive force thereof. The first magnetic sublayer 3A, which is next to the nonmagnetic material layer 4, is a layer contributing to the spin valve type of giant magnetoresistive effect.

The nonmagnetic intermediate sublayer 3B is formed from Ru (ruthenium) or the like. The nonmagnetic intermediate sublayer 3B, which is made of Ru, preferably has a thickness of 3 Å to 5 Å or 8 Å to 10 Å.

As described above, the exchange-coupled film 10 according to the first embodiment is such that the X—Mn sublayer 2B is placed on the Pt—Cr sublayer 2A. However, the exchange-coupled film 20 according to the second embodiment is such that an X—Mn sublayer 2B is placed on the pinned magnetic layer 3. The preferable composition range of the Pt—Cr sublayer 2A, which is included in the exchange-coupled film 10 (the exchange-coupled film 20), is different between the case of a configuration described in the first embodiment and the case of a configuration described in the second embodiment.

When the Pt—Cr sublayer 2A basically has an $L1_0$ ordered structure, the nature thereof as an antiferromagnetic layer is strengthened. Thus, in theory, the composition of the Pt—Cr sublayer 2A is preferably represented by the formula $Pt_{50\ at\ \%}Cr_{50\ at\ \%}$. However, the degree of influence of the Pt—Cr sublayer 2A on the X—Mn sublayer 2B, which has a particularly significant association with the intensity of the Hex, is different between the case where the X—Mn sublayer 2B is formed on the Pt—Cr sublayer 2A (the case of the first embodiment) and the case where the X—Mn sublayer 2B is formed and the Pt—Cr sublayer 2A is formed thereon (the case of the second embodiment). In particular, in the case where the X—Mn sublayer 2B is formed on the Pt—Cr sublayer 2A, the Hex is likely to be high when the content of Pt in the Pt—Cr sublayer 2A is higher than the content of Cr therein.

As the temperature of annealing performed in a magnetic field for the purpose of exchange-coupling the antiferromagnetic layer 2 and the pinned magnetic layer 3 together is higher, the tendency that the Hex is likely to be high when the content of Pt in the Pt—Cr sublayer 2A is higher than the content of Cr therein is more significant. That is, in the case where the X—Mn sublayer 2B is formed on the Pt—Cr sublayer 2A, as the temperature of annealing in a magnetic field is higher, the Pt content of the Pt—Cr sublayer 2A that gives the peak value of the Hex is higher.

Thus, when the X—Mn sublayer 2B is placed on the Pt—Cr sublayer 2A, the Pt—Cr sublayer 2A preferably has a composition represented by the formula $Pt_\alpha Cr_{100\ at\ \%-\alpha}$ ($\alpha$ is 44 at % to 58 at %) in some cases, more preferably a composition represented by the formula $Pt_\alpha Cr_{100\ at\ \%-\alpha}$ ($\alpha$ is 45 at % to 57 at %) in some cases, further more preferably a composition represented by the formula $Pt_\alpha Cr_{100\ at\ \%-\alpha}$ ($\alpha$ is 48 at % to 55 at %) in some cases, and particularly preferably a composition represented by the formula $Pt_\alpha Cr_{100\ at\ \%-\alpha}$ ($\alpha$ is 49 at % to 53.5 at %) in some cases.

However, when the X—Mn sublayer 2B is placed on the pinned magnetic layer 3, the Pt—Cr sublayer 2A preferably has a composition represented by the formula $Pt_\alpha Cr_{100\ at\ \%-\alpha}$ ($\alpha$ is 44 at % to 57 at %) in some cases, more preferably a composition represented by the formula $Pt_\alpha Cr_{100\ at\ \%-\alpha}$ ($\alpha$ is 45 at % to 56 at %) in some cases, further more preferably a composition represented by the formula $Pt_\alpha Cr_{100\ at\ \%-\alpha}$ ($\alpha$ is 47 at % to 55 at %) in some cases, and particularly preferably a composition represented by the formula $Pt_\alpha Cr_{100\ at\ \%-\alpha}$ ($\alpha$ is 48 at % to 53.5 at %) in some cases.

As is clear from the above description, in the case where the X—Mn sublayer 2B is stacked on the Pt—Cr sublayer 2A when the exchange-coupled film 10 is prepared, the Pt—Cr sublayer 2A may be formed so as to have the composition represented by the formula $Pt_\alpha Cr_{100\ at\ \%-\alpha}$ ($\alpha$ is 44 at % to 58 at %). In the case where the X—Mn sublayer 2B is stacked on the pinned magnetic layer 3, the Pt—Cr sublayer 2A may be formed so as to have the composition represented by the formula $Pt_\alpha Cr_{100\ at\ \%-\alpha}$ ($\alpha$ is 44 at % to 57 at %). When the Pt—Cr sublayer 2A is formed, Pt and Cr may be supplied together or may be alternately supplied. An example of the former is the co-sputtering of Pt and Cr. An example of the latter is the alternate stacking of a Pt layer and a Cr layer. Supplying Pt and Cr together is more preferable than alternately supplying Pt and Cr for the purpose of increasing the Hex in some cases.

Configuration of Magnetic Sensor

Figure 3:
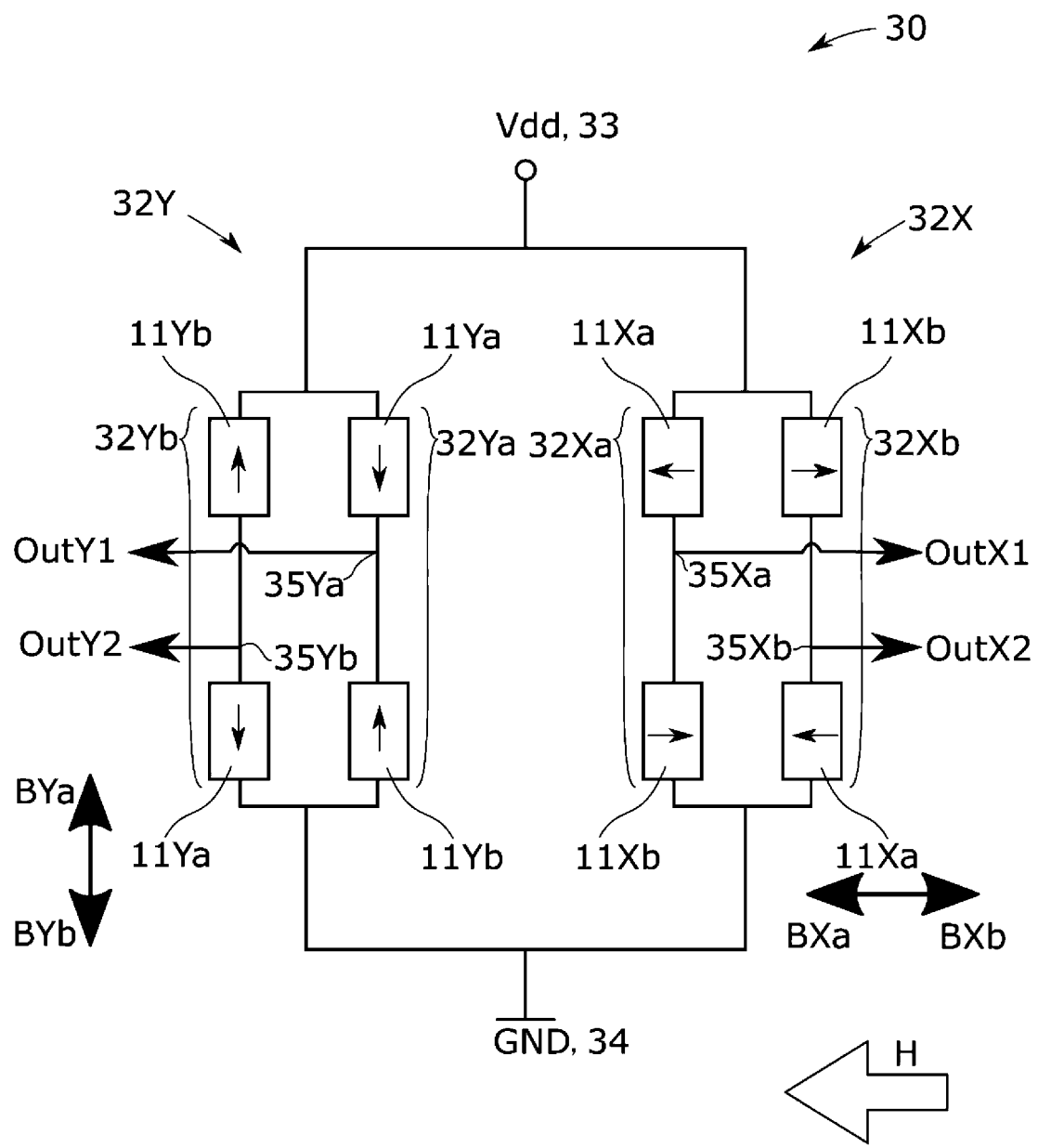
FIG. 3 is a circuit block diagram of a magnetic sensor according to an embodiment of the present invention.

FIG. 3 shows a magnetic sensor (magnetic sensing device) 30 including a plurality of magnetic sensing elements identical to the magnetic sensing element 11 shown in FIG. 1. Referring to FIG. 3, the magnetic sensing elements are different in pinned magnetization direction P (refer to FIG. 1) and are given different reference numerals 11Xa, 11Xb, 11Ya, and 11Yb for discrimination purposes. In the magnetic sensor 30, the magnetic sensing elements 11Xa, 11Xb, 11Ya, and 11Yb are placed on a single substrate.

As shown in FIG. 3, the magnetic sensor 30 includes a full bridge circuit 32X and a full bridge circuit 32Y. The full bridge circuit 32X includes the two magnetic sensing elements 11Xa and the two magnetic sensing elements 11Xb. The full bridge circuit 32Y includes the two magnetic sensing elements 11Ya and two magnetic sensing elements 11Yb. The magnetic sensing elements 11Xa, 11Xb, 11Ya, and 11Yb have the film structure of the exchange-coupled film 10 of the magnetic sensing element 11 shown in FIG. 1. These are hereinafter appropriately referred to as the magnetic sensing elements 11 unless these are discriminated.

The full bridge circuit 32X and the full bridge circuit 32Y include the magnetic sensing elements 11 having different pinned magnetization directions indicated by arrows as shown in FIG. 3 for the purpose of allowing detected magnetic field directions to differ and have the same mechanism for detecting a magnetic field. A mechanism for detecting a magnetic field using the full bridge circuit 32X is described below.

The full bridge circuit 32X is composed of a first series section 32Xa and second series section 32Xb connected in series to each other. The first series section 32Xa is composed of the magnetic sensing elements 11Xa and 11Xb connected in series to each other. The second series section 32Xb is composed of the magnetic sensing elements 11Xb and 11Xa connected in series to each other.

A power-supply voltage Vdd is applied to a power-supply terminal 33 common to the magnetic sensing element 11Xa included in the first series section 32Xa and the magnetic sensing element 11Xb included in the second series section 32Xb. A ground terminal 34 common to the magnetic sensing element 11Xb included in the first series section 32Xa and the magnetic sensing element 11Xa included in the second series section 32Xb is set to the ground potential GND.

The differential output (OutX1)–(OutX2) between the output potential (OutX1) of the midpoint 35Xa of the first series section 32Xa and the output potential (OutX2) of the midpoint 35Xb of the second series section 32Xb is obtained as a detection output (detection output voltage) VXs in an X-direction.

The full bridge circuit 32Y works similarly to the full bridge circuit 32X and therefore the differential output (OutY1)–(OutY2) between the output potential (OutY1) of the midpoint 35Ya of a first series section 32Ya included in the full bridge circuit 32Y and the output potential (OutY2) of the midpoint 35Yb of a second series section 32Yb included in the full bridge circuit 32Y is obtained as a detection output (detection output voltage) VYs in a Y-direction.

As indicated by arrows in FIG. 3, the sensitivity axis direction of each of the magnetic sensing elements 11Xa and 11Xb forming the full bridge circuit 32X is perpendicular to the sensitivity axis direction of each of the magnetic sensing elements 11Ya and 11Yb forming the full bridge circuit 32Y.

As shown in FIG. 3, in the magnetic sensor 30, the orientation of the free magnetic layer 5 of each magnetic sensing element 11 varies so as to follow the direction of an external magnetic field H. In this event, the resistance varies depending on the vector relationship between the pinned magnetization direction P of the pinned magnetic layer 3 and the magnetization direction of the free magnetic layer 5.

Supposing that, for example, the external magnetic field H acts in a direction shown in FIG. 3. The magnetic sensing element 11Xa included in the full bridge circuit 32X exhibits a reduced electrical resistance because the sensitivity axis direction coincides with the direction of the external magnetic field H. However, the magnetic sensing element 11Xb exhibits an increased electrical resistance because the sensitivity axis direction is opposite to the direction of the external magnetic field H. The change of the electrical resistance allows the detection output voltage VXs= (OutX1)–(OutX2) to peak. As the external magnetic field H changes rightward with respect to the plane of FIG. 3, the detection output voltage VXs decreases. As the external magnetic field H changes upward or downward with respect to the plane of FIG. 3, the detection output voltage VXs decreases to zero.

On the other hand, in the full bridge circuit 32Y, when the external magnetic field H is leftward with respect to the plane of FIG. 3, the magnetization direction of the free magnetic layer 5 of every magnetic sensing element 11 is perpendicular to the sensitivity axis direction (pinned magnetization direction P) and therefore the magnetic sensing elements 11Ya and 11Xb exhibit the same resistance. Thus, the detection output voltage VYs is zero. When the external magnetic field H acts downward with respect to the plane of FIG. 3, the detection output voltage VYs=(OutY1)–(OutY2) of the full bridge circuit 32Y peaks. As the external magnetic field H changes upward with respect to the plane thereof, the detection output voltage VYs decreases.

As described above, as the direction of the external magnetic field H changes, the detection output voltage VXs of the full bridge circuit 32X and the detection output voltage VYs of the full bridge circuit 32Y vary. Thus, the movement direction and travel distance (relative position) of a detection target can be detected on the basis of the detection output voltages VXs and VYs obtained from the full bridge circuits 32X and 32Y.

FIG. 3 shows the magnetic sensor 30, which is configured to be capable of detecting a magnetic field in the X-direction and a Y-direction perpendicular to the X-direction. However, the magnetic sensor 30 may be configured to include the full bridge circuit 32X or the full bridge circuit 32Y only so as to detect a magnetic field in the X-direction or the Y-direction, respectively, only.

Figure 4:
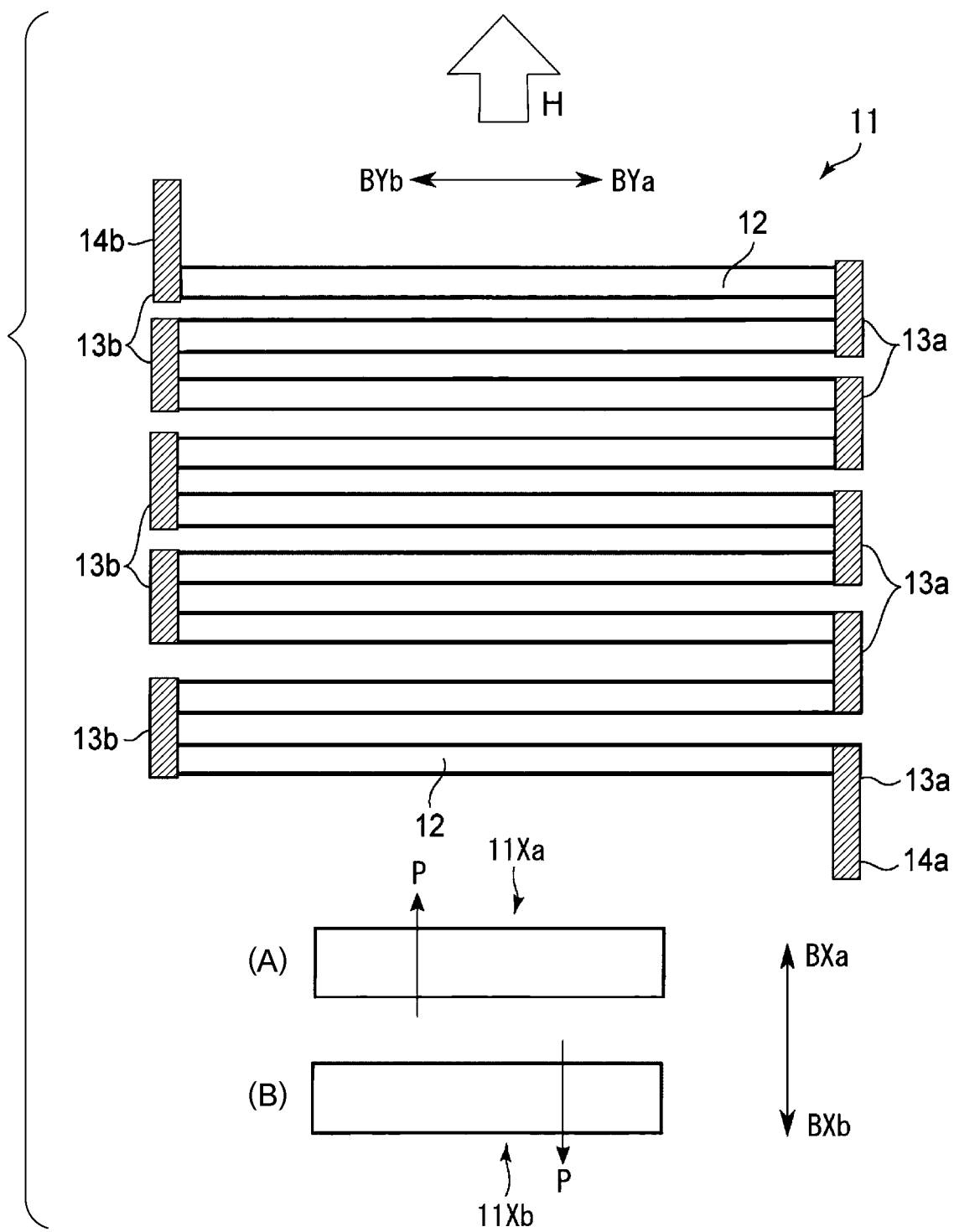
FIG. 4 is a plan view showing magnetic sensing elements 11 used in the magnetic sensor.

FIG. 4 shows the planar structure of each of the magnetic sensing elements 11Xa and 11Xb. In FIGS. 3 and 4, a BXa-BXb direction is the X-direction. In FIG. 4, (A) and (B) show the pinned magnetization directions P of the magnetic sensing elements 11Xa and 11Xb as indicated by arrows. The pinned magnetization directions P of the magnetic sensing elements 11Xa and 11Xb are the X-direction and are opposite to each other.

As shown in FIG. 4, the magnetic sensing elements 11Xa and 11Xb each include stripe-shaped element sections 12. The longitudinal direction of each element section 12 is directed in a BYa-BYb direction. A plurality of the element sections 12 are placed in parallel to each other. Illustrated right end portions of the neighboring element sections 12 are connected to each other with conductive sections 13a. Illustrated left end portions of the neighboring element sections 12 are connected to each other with conductive sections 13b. The conductive sections 13a and 13b are alternately connected to the illustrated right and left end portions of the element sections 12, whereby the element sections 12 are coupled to each other in a so-called meander pattern. In the magnetic sensing elements 11Xa and 11Xb, the conductive section 13a shown in a lower right portion is united with a connection terminal 14a and the conductive section 13b shown in an upper left portion is united with a connection terminal 14b.

Each element section 12 is composed of a plurality of stacked metal layers (alloy layers). FIG. 1 shows the multilayer structure of the element section 12. The element section 12 may have a multilayer structure shown in FIG. 2.

In the magnetic sensor 30 shown in FIGS. 3 and 4, the magnetic sensing element 11 can be replaced with the magnetic sensing element 21, shown in FIG. 2, according to the second embodiment.

EXAMPLES

Example 1

A magnetic sensing element 11 (refer to FIG. 1) including an exchange-coupled film 10 having a film configuration below was prepared. In examples, comparative examples, and reference examples below, a parenthesized value is a thickness (Å). The exchange-coupled film 10 was annealed at 400° C. for 5 hours in a magnetic field of 1 kOe, whereby the magnetization of each of a pinned magnetic layer 3 and an antiferromagnetic layer 2 was pinned.

Substrate/base layer 1: Ni—Fe—Cr (60)/antiferromagnetic layer 2 [Pt—Cr sublayer 2A: $Pt_{51\ at\ \%}$—$Cr_{49\ at\ \%}$ (280)/X—Mn sublayer 2B: $Pt_{50\ at\ \%}$—$Mn_{50\ at\ \%}$ (20)]/pinned magnetic layer 3: $Co_{90\ at\ \%}$—$Fe_{10at\ \%}$ (50)/nonmagnetic material layer 4: Cu (40)/free magnetic layer 5: $Co_{90\ at\ \%}$—$Fe_{10\ at\ \%}$ (15)/$Ni_{81.5\ at\ \%}$—$Fe_{18.5\ at\ \%}$ (30)/protective layer 6: Ta (50)

Example 2

A magnetic sensing element 11 including an exchange-coupled film 10 having a film configuration below was prepared by changing a Pt—Cr sublayer 2A of an antiferromagnetic layer 2 from $Pt_{51\ at\ \%}$—$Cr_{49\ at\ \%}$ (280) prepared in Example 1 to $Pt_{54\ at\ \%}$—$Cr_{46\ at\ \%}$ (280).

Substrate/base layer 1: Ni—Fe—Cr (60)/antiferromagnetic layer 2 [Pt—Cr sublayer 2A: $Pt_{54\ at\ \%}$—$Cr_{46\ at\ \%}$ (280)/X—Mn sublayer 2B: $Pt_{50\ at\ \%}$—$Mn_{50\ at\ \%}$ (20)]/pinned magnetic layer 3: $Co_{90\ at\ \%}$—$Fe_{10at\ \%}$ (50)/nonmagnetic material layer 4: Cu (40)/free magnetic layer 5: $Co_{90\ at\ \%}$—$Fe_{10\ at\ \%}$ (15)/$Ni_{81.5\ at\ \%}$—$Fe_{18.5\ at\ \%}$ (30)/protective layer 6: Ta (50)

Comparative Example 1

A magnetic sensing element 11 including an exchange-coupled film 10 having a film configuration below was prepared by changing an antiferromagnetic layer 2 from [Pt—Cr sublayer 2A: $Pt_{51\ at\ \%}$—$Cr_{49\ at\ \%}$ (280)/X—Mn sublayer 2B: $Pt_{50\ at\ \%}$—$Mn_{50\ at\ \%}$ (20)] prepared in Example 1 to $Pt_{50\ at\ \%}$—$Mn_{50\ at\ \%}$ (300).

Substrate/base layer 1: Ni—Fe—Cr (60)/antiferromagnetic layer 2: $Pt_{50\ at\ \%}$—$Mn_{50\ at\ \%}$ (300)/pinned magnetic layer 3: $Co_{90\ at\ \%}$—$Fe_{10\ at\ \%}$ (50)/nonmagnetic material layer 4: Cu (40)/free magnetic layer 5: $Co_{90\ at\ \%}$—$Fe_{10\ at\ \%}$ (15)/$Ni_{81.5\ at\ \%}$—$Fe_{18.5at\ \%}$ (30)/protective layer 6: Ta (50)

Application of External Magnetic Field

An external magnetic field H was applied to the magnetic sensing element 11 prepared in each of Example 1, Example 2, and Comparative Example 1 from a direction parallel to the pinned magnetization direction (a P-direction in FIG. 1) of the pinned magnetic layer 3 of the exchange-coupled film 10, whereby the rate (rate of change in resistance) ΔMR (ΔR/R) at which the electrical resistance R was changed by the magnetic field H was determined.

Figure 5:
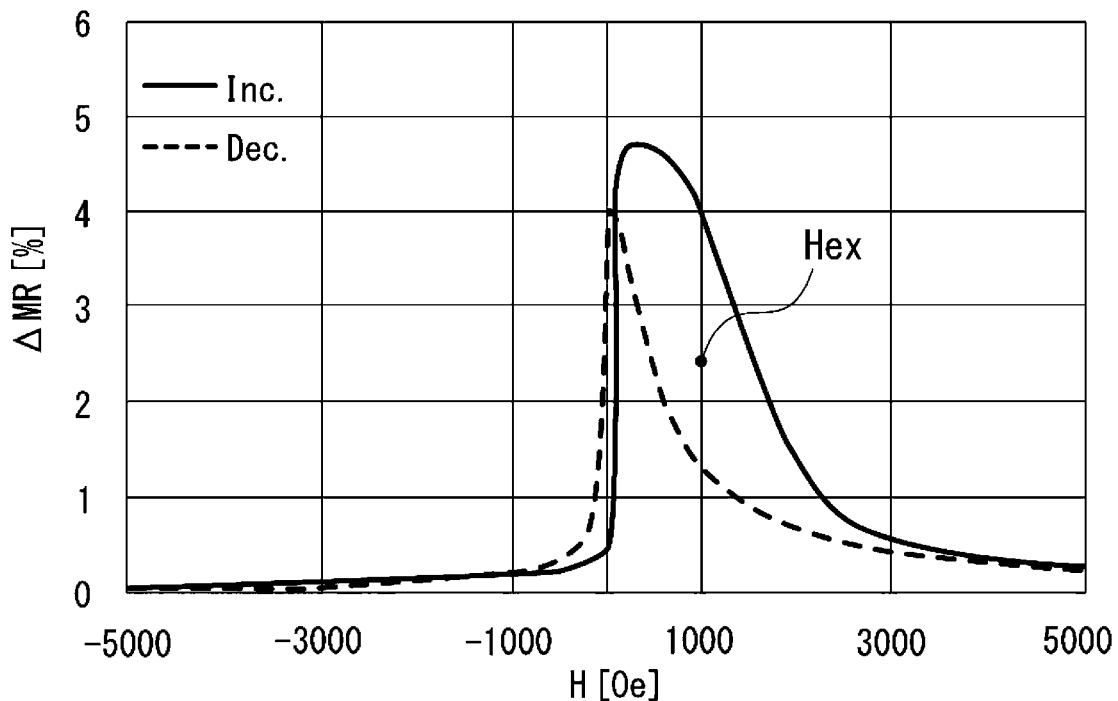
FIG. 5 is a graph showing R-H curves of a magnetic sensing element prepared in Example 1.
Figure 6:
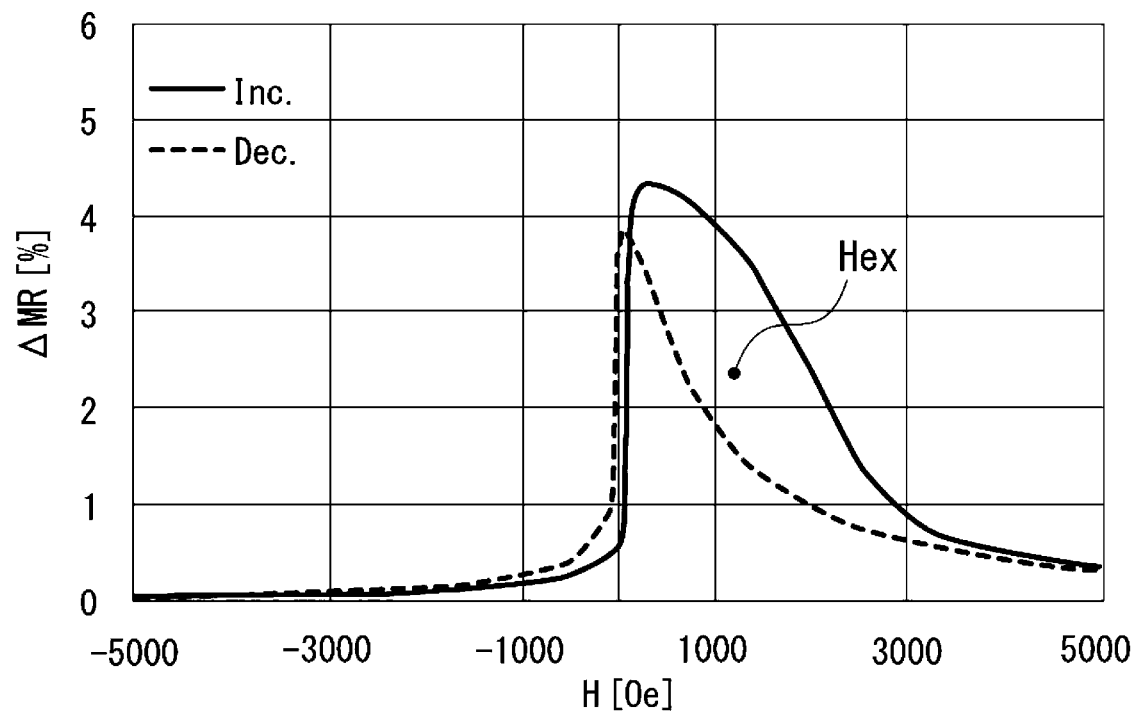
FIG. 6 is a graph showing R-H curves of a magnetic sensing element prepared in Example 2.
Figure 7:
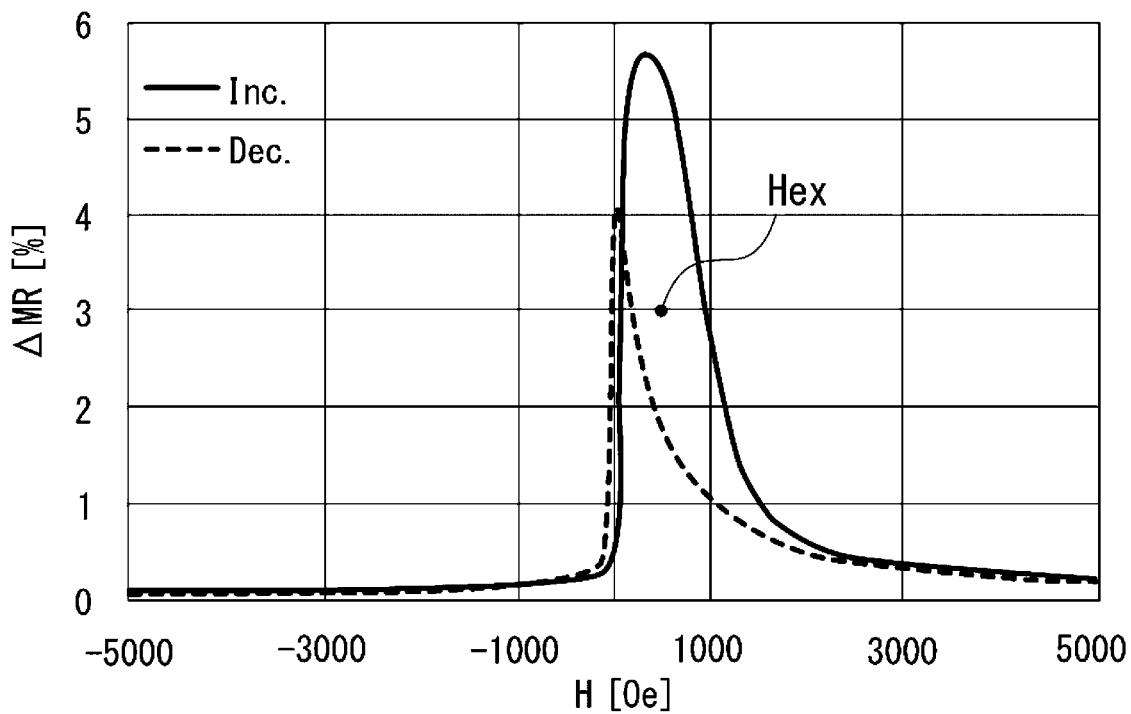
FIG. 7 is a graph showing R-H curves of a magnetic sensing element prepared in Comparative Example 1.

FIG. 5, FIG. 6, and FIG. 7 show R-H curves of the magnetic sensing element 11 prepared in Example 1, R-H curves of the magnetic sensing element 11 prepared in Example 2, and R-H curves of the magnetic sensing element 11 prepared in Comparative Example 1, respectively. In each of these figures, the horizontal axis represents the intensity [Oe] of the magnetic field H, the vertical axis represents the rate of change in resistance ΔMR [%], a curve (a curve located on a lower side at H=1,000 [Oe]) marked "Inc." represents ΔMR in the case of increasing the magnetic field H, and a curve (a curve located on an upper side at H=1,000 [Oe]) marked "Dec." represents ΔMR in the case of reducing the magnetic field H.

Referring to FIGS. 5 to 7, hysteresis appears in the variation curve "Inc." of the rate of change in resistance ΔMR [%] in the case of changing the magnetic field to a positive side and the variation curve "Dec." of the rate of change in resistance ΔMR [%] in the case of changing the magnetic field to a negative side and the median of the full width at half maximum of each of the variation curve "Inc." and the variation curve "Dec." substantially coincides with the magnetic field (Hex) at which the magnetization direction of a pinned magnetic layer is reversed.

It was clear that the magnetic sensing element 11 prepared in Example 1 and the magnetic sensing element 11 prepared in Example 2 exhibited a higher magnetic field (Hex) as compared to the magnetic sensing element 11 prepared in Comparative Example 1. That is, the magnetic sensing elements 11 including the exchange-coupled films 10 prepared in Examples 1 and 2 can sufficiently measure a magnetic field in a strong-magnetic field environment.

Example 3

Exchange-coupled films 10 (refer to FIG. 1) having a film configuration below were prepared by varying the thickness D1 of a Pt—Cr sublayer 2A of an antiferromagnetic layer 2 and the thickness D2 of a Pt—Mn sublayer 2B thereof. The exchange-coupled films 10 were annealed at 400° C. for 5 hours in a magnetic field of 1 kOe, whereby the magnetization of each of a pinned magnetic layer 3 and the antiferromagnetic layer 2 was pinned.

Substrate/base layer 1: Ni—Fe—Cr (60)/antiferromagnetic layer 2 [Pt—Cr sublayer 2A: $Pt_{54\ at\ \%}$—$Cr_{46\ at\ \%}$ (300−x)/X—Mn sublayer 2B: $Pt_{50\ at\ \%}$—$Mn_{50\ at\ \%}$ (x)]/pinned magnetic layer 3: $Co_{90\ at\ \%}$—$Fe_{10\ at\ \%}$ (50)/nonmagnetic material layer 4: Cu (40)/free magnetic layer 5: $Co_{90\ at\ \%}$—$Fe_{10\ at\ \%}$ (15)/$Ni_{81.5\ at\ \%}$—$Fe_{18.5at\ \%}$ (30)/protective layer 6: Ta (50)

For each exchange-coupled film 10 including the Pt—Cr sublayer 2A and Pt—Mn sublayer having a thickness shown in Table 1, the Hex calculated from an R-H curve was as described below. Hereinafter, $Pt_{54\ at\ \%}$—$Cr_{46\ at\ \%}$ is appropriately referred to as 54Pt—Cr, $Pt_{51\ at\ \%}$—$Cr_{49\ at\ \%}$ is appropriately referred to as 51Pt—Cr, and $Pt_{50\ at\ \%}$—$Mn_{50\ at\ \%}$ is appropriately referred to as Pt—Mn.

TABLE 1

| Thickness of 54Pt—Cr sublayer D1 [Å] (300-x) | Thickness of Pt—Mn sublayer D2 [Å] (x) | Hex at room temperature Hex [Oe] |
|---|---|---|
| 300 | 0 | 238 |
| 298 | 2 | 364 |
| 296 | 4 | 519 |
| 294 | 6 | 634 |
| 292 | 8 | 790 |
| 290 | 10 | 917 |
| 288 | 12 | 1033 |
| 286 | 14 | 1149 |
| 284 | 16 | 1263 |
| 282 | 18 | 1348 |
| 280 | 20 | 1430 |
| 278 | 22 | 1462 |
| 276 | 24 | 1463 |
| 274 | 26 | 1466 |
| 272 | 28 | 1423 |
| 270 | 30 | 1372 |
| 266 | 34 | 1034 |
| 262 | 38 | 842 |
| 250 | 50 | 721 |
| 200 | 100 | 620 |
| 100 | 200 | 724 |
| 0 | 300 | 590 |

Example 4

Exchange-coupled films 10 having a film configuration below were prepared by changing a Pt—Cr sublayer 2A of an antiferromagnetic layer 2 from 54Pt—Cr (280-x) prepared in Example 3 to 51Pt—Cr (280-x). The exchange-coupled films 10 were annealed at 400° C. for 5 hours in a magnetic field of 1 kOe, whereby the magnetization of each of a pinned magnetic layer 3 and the antiferromagnetic layer 2 was pinned.

Substrate/base layer 1: Ni—Fe—Cr (60)/antiferromagnetic layer 2 [Pt—Cr sublayer 2A: $Pt_{51\ at\ \%}$—$Cr_{49\ at\ \%}$ (300-x)/X—Mn sublayer 2B: $Pt_{50\ at\ \%}$—$Mn_{50\ at\ \%}$ (x)]/pinned magnetic layer 3: $Co_{90\ at\ \%}$—$Fe_{10\ at\ \%}$ (50)/nonmagnetic material layer 4: Cu (40)/free magnetic layer 5: $Co_{90\ at\ \%}$—$Fe_{10\ at\ \%}$ (15)/$Ni_{81.5\ at\ \%}$—$Fe_{18.5\ at\ \%}$ (30)/protective layer 6: Ta (50)

For each exchange-coupled film 10 including the Pt—Cr sublayer 2A and Pt—Mn sublayer having a thickness shown in Table 2, the Hex calculated from an R-H curve was as described below.

TABLE 2

| Thickness of 51Pt—Cr sublayer D1 [Å] | Thickness of Pt—Mn sublayer D2 [Å] | Hex at room temperature Hex [Oe] |
|---|---|---|
| 300 | 0 | 111 |
| 296 | 4 | 298 |
| 292 | 8 | 522 |
| 288 | 12 | 717 |
| 284 | 16 | 893 |
| 280 | 20 | 1039 |
| 276 | 24 | 1141 |
| 272 | 28 | 1113 |
| 250 | 50 | 610 |
| 200 | 100 | 523 |
| 100 | 200 | 663 |
| 0 | 300 | 590 |

Example 5

Exchange-coupled films 10 having the same film configuration as that of Example 4 were prepared and the temperature of annealing was changed from 400° C. of Example 4 to 350° C.

For each exchange-coupled film 10 including a 51Pt—Cr sublayer and Pt—Mn sublayer having a thickness shown in Table 3, the Hex calculated from an R-H curve was as described below.

TABLE 3

| Thickness of 51Pt—Cr sublayer D1 [Å] | Thickness of Pt—Mn sublayer D2 [Å] | Hex at room temperature Hex [Oe] |
|---|---|---|
| 300 | 0 | 210 |
| 296 | 4 | 407 |
| 292 | 8 | 709 |
| 288 | 12 | 840 |
| 284 | 16 | 951 |
| 280 | 20 | 1056 |
| 276 | 24 | 1064 |
| 272 | 28 | 1131 |
| 250 | 50 | 740 |
| 200 | 100 | 600 |
| 100 | 200 | 688 |
| 0 | 300 | 612 |

Figure 8:
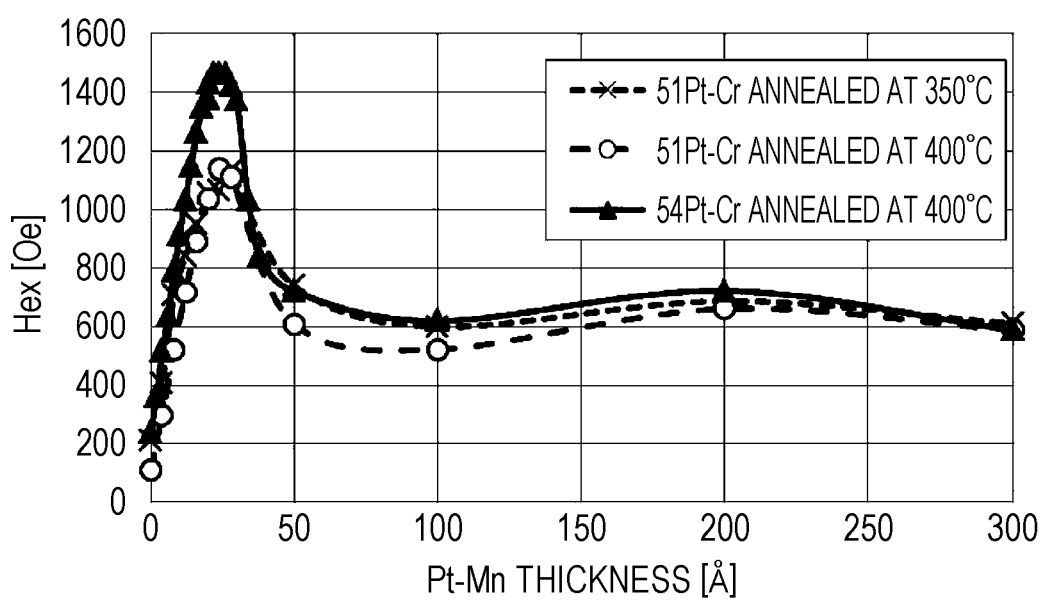
FIG. 8 is a graph showing the Hex of each of exchange-coupled films prepared in Examples 3 to 5.

FIG. 8 is a graph showing the Hex of each of the exchange-coupled films 10 prepared in Examples 3 to 5. In this figure, the horizontal axis represents the thickness of a Pt—Mn sublayer (Pt—Mn thickness, [Å]) and the vertical axis represents the Hex [Oe] of an exchange-coupled film. As is clear from FIG. 8 and Tables 1 to 3, using either of 51Pt—Cr and 54Pt—Cr as a Pt—Cr sublayer allows the exchange-coupled films 10 to exhibit a higher Hex as compared to those including an antiferromagnetic layer composed of a Pt—Mn sublayer only.

From the viewpoint of allowing an exchange-coupled film 10 to have a high Hex, 54Pt—Cr is preferably used as a Pt—Cr sublayer. Even if the annealing temperature is 350° C., an exchange-coupled film 10 having substantially the same Hex as that at 400° C. is obtained. Therefore, from the viewpoint of reducing the annealing temperature, 51Pt—Cr is preferably used as a Pt—Cr sublayer.

Example 6

Exchange-coupled films 10 having a film configuration below were prepared by changing an X—Mn sublayer 2B of an antiferromagnetic layer 2 from Pt—Mn prepared in Example 3 to Ir—Mn. The exchange-coupled films 10 were annealed at 400° C. for 5 hours in a magnetic field of 1 kOe, whereby the magnetization of each of a pinned magnetic layer 3 and the antiferromagnetic layer 2 was pinned.

Substrate/base layer 1: Ni—Fe—Cr (60)/antiferromagnetic layer 2 [Pt—Cr sublayer 2A: $Pt_{54\ at\ \%}$—$Cr_{46\ at\ \%}$ (300-x)/X—Mn sublayer 2B: $Ir_{50\ at\ \%}$—$Mn_{50\ at\ \%}$ (x)]/pinned magnetic layer 3: $Co_{90\ at\ \%}$—$Fe_{10\ at\ \%}$ (50)/nonmagnetic material layer 4: Cu (40)/free magnetic layer 5: $Co_{90\ at\ \%}$—$Fe_{10\ at\ \%}$ (15)/$Ni_{81.5\ at\ \%}$—$Fe_{18.5\ at\ \%}$ (30)/protective layer 6: Ta (50)

For each exchange-coupled film 10 including a Pt—Cr sublayer and Ir—Mn sublayer having a thickness shown in Table 4, the Hex calculated from an R-H curve was as described below.

TABLE 4

| Thickness of Pt—Cr sublayer D1 [Å] | Thickness of Ir—Mn sublayer D2 [Å] | Hex at room temperature Hex [Oe] |
|---|---|---|
| 300 | 0 | 238 |
| 298 | 2 | 283 |
| 296 | 4 | 293 |
| 294 | 6 | 281 |
| 292 | 8 | 199 |
| 290 | 10 | 156 |
| 280 | 20 | 85 |
| 260 | 40 | 167 |
| 0 | 80 | 162 |

Figure 9:
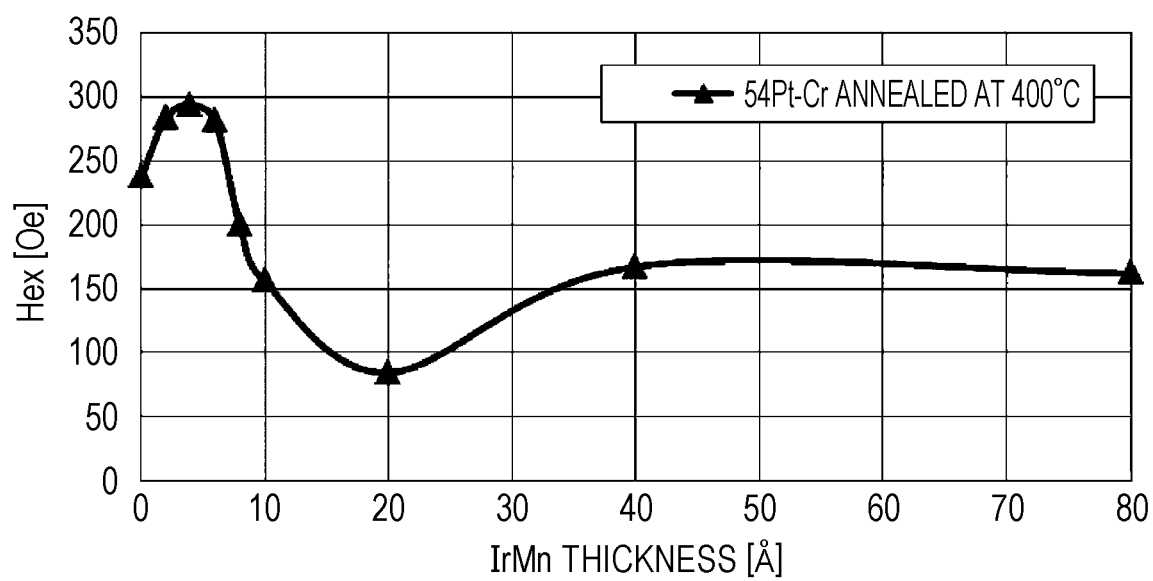
FIG. 9 is a graph showing the Hex of each of exchange-coupled films prepared in Example 6.
Figure 10A:
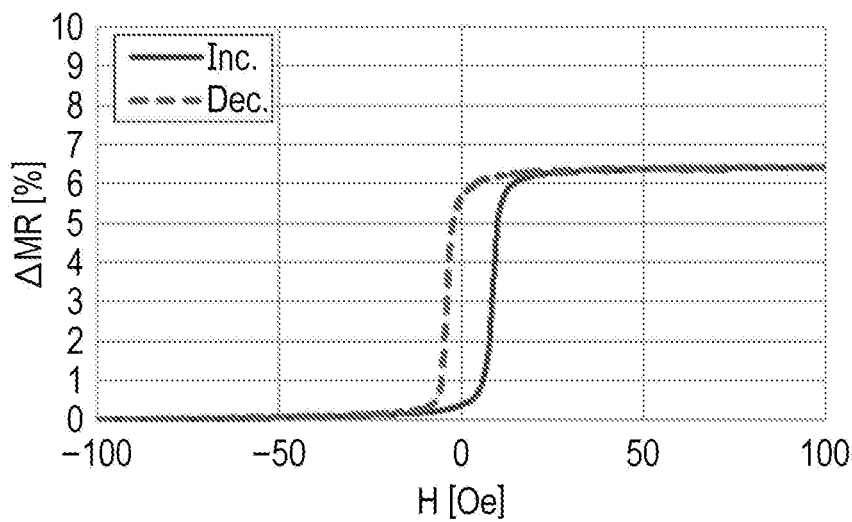
FIGS. 10A to 10C are graphs showing R-H curves of a magnetic sensing element prepared in Example 7.
Figure 10B:
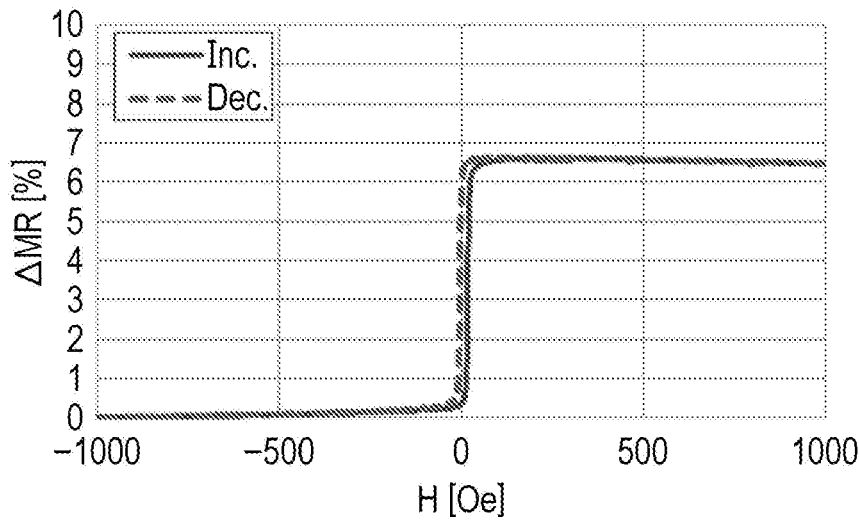
Figure 10C:
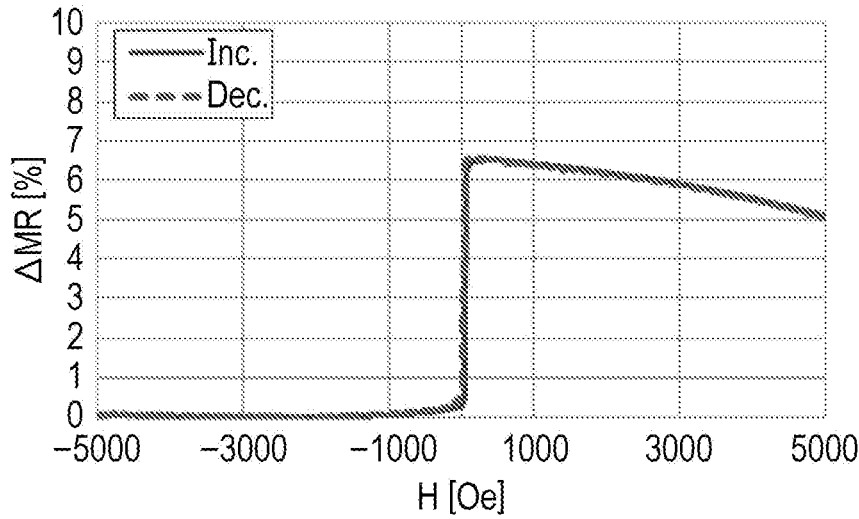
Figure 11A:
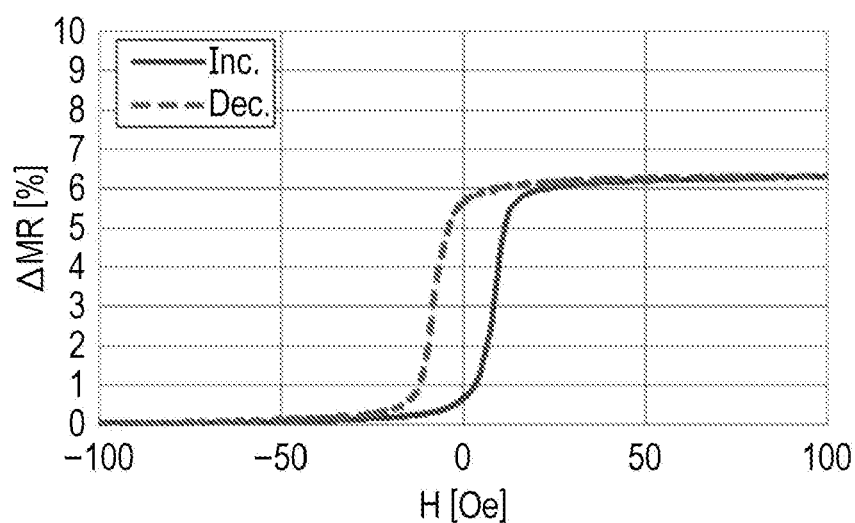
FIGS. 11A to 11C are graphs showing R-H curves of a magnetic sensing element prepared in Example 8.
Figure 11B:
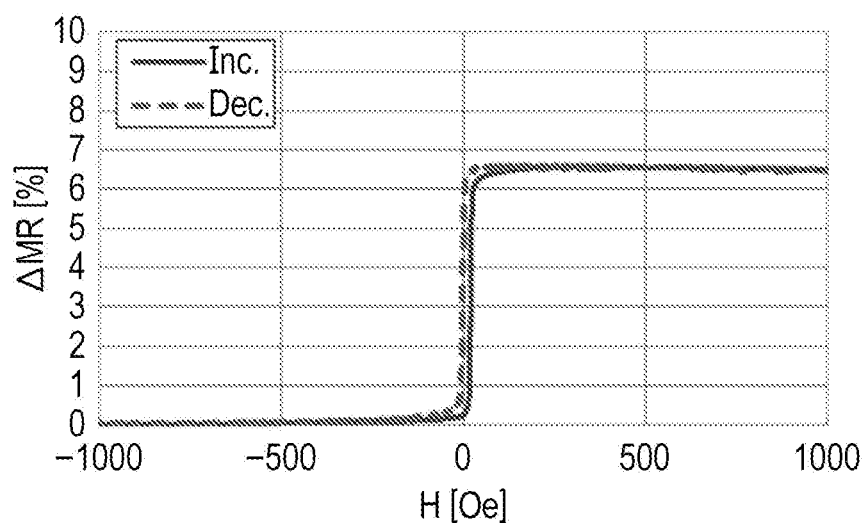
Figure 11C:
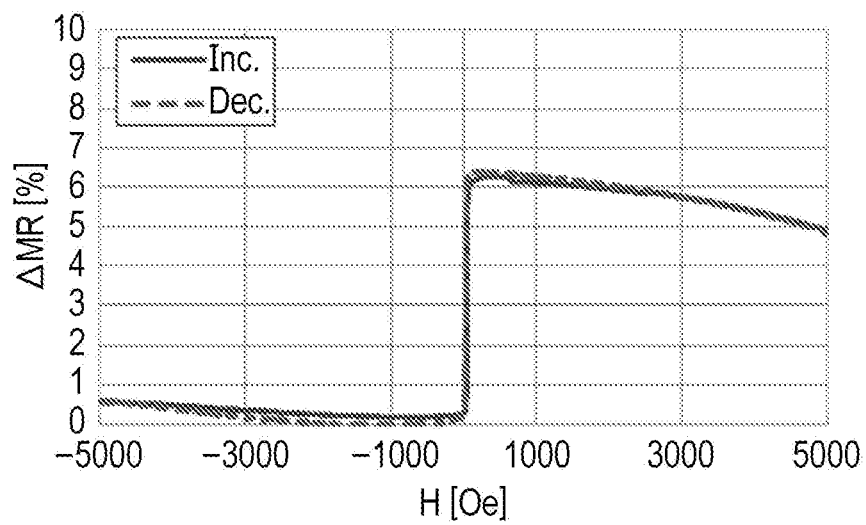

FIG. 9 is a graph showing the Hex of each of the exchange-coupled films 10 prepared in Example 6. In this figure, the horizontal axis represents the thickness of an Ir—Mn sublayer (Ir—Mn thickness [Å]) and the vertical axis represents the Hex [Oe] of an exchange-coupled film. As is clear from FIG. 9 and Table 4, the effect of increasing the Hex of a Pt—Cr sublayer is provided by an antiferromagnetic layer combined with Ir—Mn similarly to a Pt—Mn sublayer.

Example 7

A magnetic sensing element 21 (refer to FIG. 2) including an exchange-coupled film 20 having a film configuration below was prepared. A parenthesized value is a thickness (Å). The exchange-coupled film 20 was annealed at 350° C. for 5 hours in no magnetic field and was thereby stabilized.
Substrate/base layer 1: Ni—Fe—Cr (42)/free magnetic layer 5: $Ni_{81.5\ at\ \%}$—$Fe_{18.5\ at\ \%}$ (18)/:$Co_{90\ at\ \%}$—$Fe_{10\ at\ \%}$ (14)/nonmagnetic material layer 4: Cu (30)/pinned magnetic layer 3 [first magnetic sublayer 3A: $Co_{90\ at\ \%}$—$Fe_{10\ at\ \%}$ (24)/nonmagnetic intermediate sublayer 3B: Ru (3.6)]/second magnetic sublayer 3C: $Fe_{60\ at\ \%}$—$Co_{40\ at\ \%}$ (17)/antiferromagnetic layer 2 [X—Mn sublayer: $Pt_{50\ at\ \%}$—$Mn_{50\ at\ \%}$ (20)/$Pt_{51\ at\ \%}$—$Cr_{49\ at\ \%}$ (280)]/protective layer 6: Ta (90)

Example 8

A magnetic sensing element 21 including an exchange-coupled film 20 having a film configuration below was prepared by changing an antiferromagnetic layer 2 from [X—Mn sublayer: Pt—Mn (20)/51Pt—Cr (280)] prepared in Example 7 to [X—Mn sublayer: Ir—Mn (4)/51Pt—Cr (296)].
Substrate/base layer 1: Ni—Fe—Cr (42)/free magnetic layer 5: $Ni_{81.5\ at\ \%}$—$Fe_{18.5\ at\ \%}$ (18)/:$Co_{90\ at\ \%}$—$Fe_{10\ at\ \%}$ (14)/nonmagnetic material layer 4: Cu (30)/pinned magnetic layer 3 [first magnetic sublayer 3A: $Co_{90\ at\ \%}$—$Fe_{10\ at\ \%}$ (24)/nonmagnetic intermediate sublayer 3B: Ru (3.6)]/second magnetic sublayer 3C: $Fe_{60\ at\ \%}$—$Co_{40\ at\ \%}$ (17)/antiferromagnetic layer 2 [X—Mn sublayer: $Ir_{50\ at\ \%}$—$Mn_{50\ at\ \%}$ (4)/$Pt_{51\ at\ \%}$—$Cr_{49\ at\ \%}$ (296)]/protective layer 6: Ta (90)

Comparative Example 2

A magnetic sensing element 21 including an exchange-coupled film 20 having a film configuration below was prepared by changing an antiferromagnetic layer 2 from [X—Mn sublayer: Pt—Mn (20)/51Pt—Cr (280)] prepared in Example 7 to Pt—Mn (300).
Substrate/base layer 1: Ni—Fe—Cr (42)/free magnetic layer 5: $Ni_{81.5\ at\ \%}$—$Fe_{18.5\ at\ \%}$ (18)/:$Co_{90\ at\ \%}$—$Fe_{10\ at\ \%}$ (14)/nonmagnetic material layer 4: Cu (30)/pinned magnetic layer 3 [first magnetic sublayer 3A: $Co_{90\ at\ \%}$—$Fe_{10\ at\ \%}$ (24)/nonmagnetic intermediate sublayer 3B: Ru (3.6)]/second magnetic sublayer 3C: $Fe_{60\ at\ \%}$—$Co_{40\ at\ \%}$ (17)/antiferromagnetic layer 2: $Pt_{50\ at\ \%}$—$Mn_{50\ at\ \%}$ (300)/protective layer 6: Ta (90)

Application of External Magnetic Field

An external magnetic field H was applied to the magnetic sensing element 21 prepared in each of Example 7, Example 8, and Comparative Example 2 from a direction parallel to the pinned magnetization direction (a P1 direction in FIG. 2) of the pinned magnetic layer 3, whereby the rate of change in resistance ΔMR (ΔR/R) was determined.

FIGS. 10A to 10C, FIGS. 11A to 11C, and FIGS. 12A to 12C show R-H curves of the magnetic sensing element 21 prepared in Example 7, R-H curves of the magnetic sensing element 21 prepared in Example 8, and R-H curves of the magnetic sensing element 21 prepared in Comparative Example 2, respectively. In each of these figures, the horizontal axis represents the intensity [Oe] of the magnetic field H, the vertical axis represents ΔMR (%), a curve marked "Inc." represents ΔMR in the case of increasing the magnetic field H, and a curve marked "Dec." represents ΔMR in the case of reducing the magnetic field H.

Figure 12A:
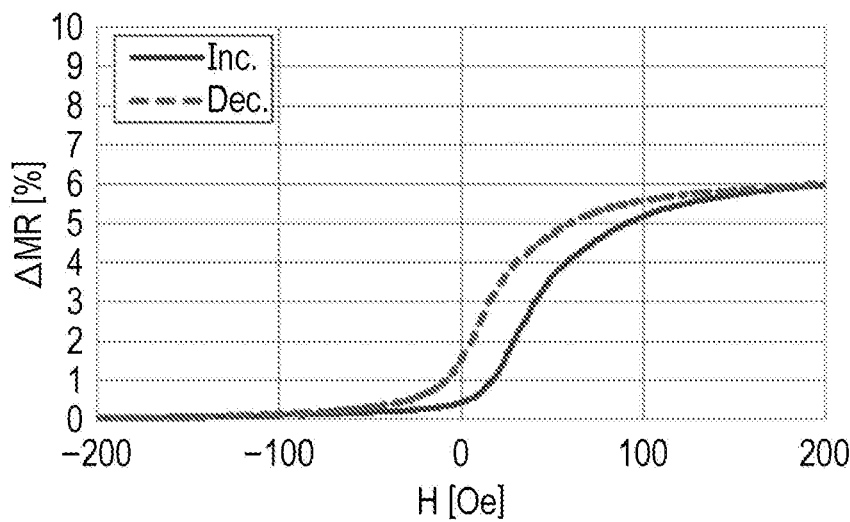
FIGS. 12A to 12C are graphs showing R-H curves of a magnetic sensing element prepared in Comparative Example 2.
Figure 12B:
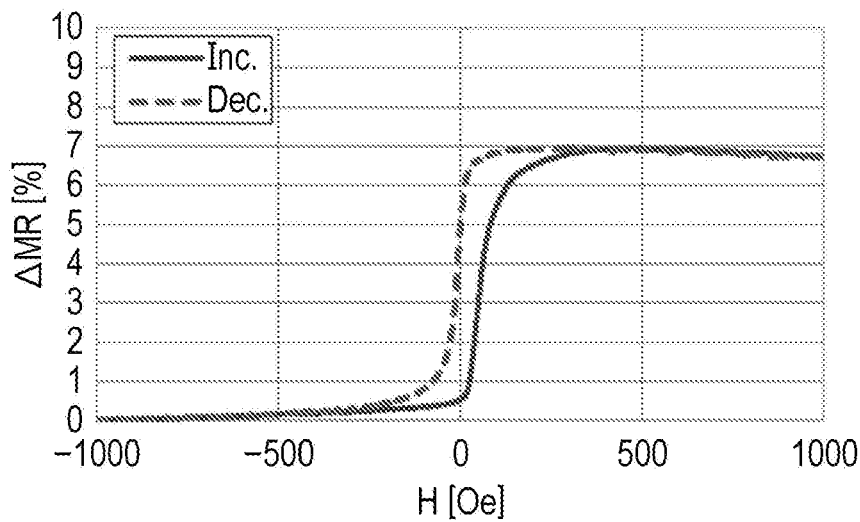
Figure 12C:
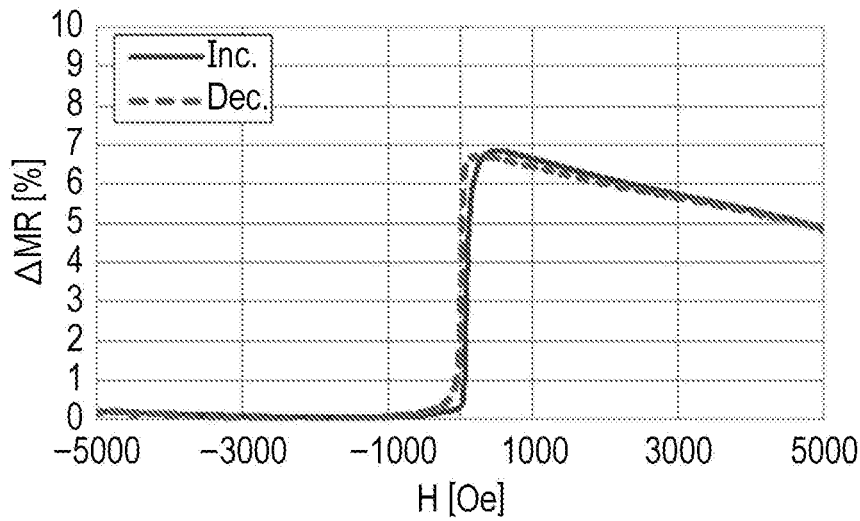

FIGS. 10A to 10C and FIGS. 11A to 11C show less hysteresis as compared to FIGS. 12A to 12C and show an improvement in a ΔMR reduction process down to +5 kOe. This result shows that an antiferromagnetic layer which is composed of a Pt—Cr sublayer and a Pt—Mn sublayer and in which the Pt—Mn sublayer is in contact with a pinned magnetic layer enhances the stabilization of an exchange-coupled film even when the pinned magnetic layer is a self-pinned layer including a first magnetic sublayer, intermediate sublayer, and second magnetic sublayer which are stacked.

Reference Example 1

Magnetic sensing elements having a film configuration below were prepared. A parenthesized value is a thickness (Å). Each exchange-coupled film 10 was annealed at 400° C. for 5 hours in a magnetic field of 1 kOe, whereby the magnetization of each of a pinned magnetic layer 3 and an antiferromagnetic layer 2 were pinned.
Substrate/base layer 1: Ni—Fe—Cr (60)/antiferromagnetic layer 2: $Pt_\alpha$—$Cr_{100\ at\ \%-\alpha}$ (300)/pinned magnetic layer 3: $Co_{90\ at\ \%}$—$Fe_{10\ at\ \%}$ (50)/nonmagnetic material layer 4: Cu (40)/free magnetic layer 5: [$Co_{90\ at\ \%}$—$Fe_{10\ at\ \%}$ (15)/81.5Ni—Fe (30)]/protective layer 6: Ta (50)
By co-sputtering Pt and Cr, $Pt_\alpha$—$Cr_{100\ at\ \%-\alpha}$ (300) films having different Pt-to-Cr ratios were prepared.

Reference Example 2

$Pt_\alpha$—$Cr_{100\ at\ \%-\alpha}$ (300) films having different Pt-to-Cr ratios were prepared in substantially the same manner as that used in Reference Example 1 except that Pt and Cr were alternately stacked instead of co-sputtering Pt and Cr.

Reference Example 3

$Pt_\alpha$—$Cr_{100\ at\ \%-\alpha}$ (300) films having different Pt-to-Cr ratios were prepared in substantially the same manner as that used in Example 1 except that a base layer 1 was changed from Ni—Fe—Cr (60) prepared in Example 1 to Ta (50).

Sputtering and Alternate Stacking

Figure 13:
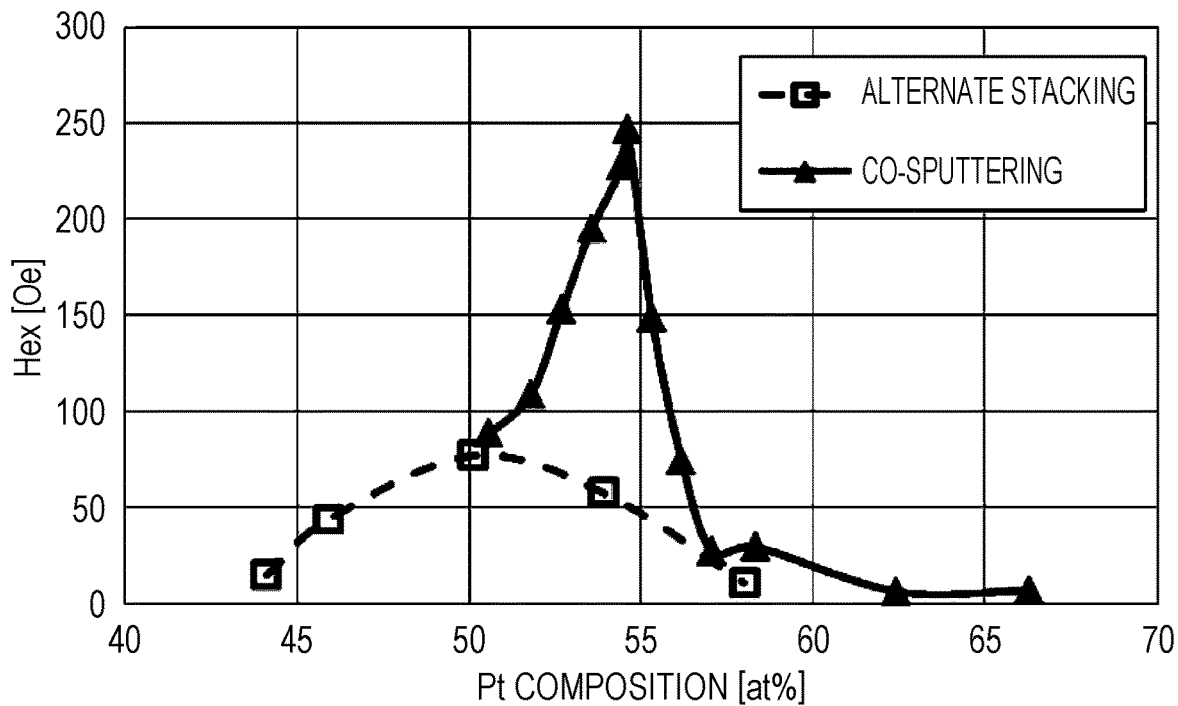
FIG. 13 is a graph showing the relationship between the percentage of Pt contained in Pt—Cr prepared in each of Reference Example 1 and Reference Example 2 and the Hex.

FIG. 13 is a graph showing the relationship between the percentage of Pt contained in Pt—Cr prepared in each of Reference Example 1 (co-sputtering) and Reference Example 2 (alternate stacking) and the Hex. As is clear from this figure, Reference Example 1, in which $Pt_\alpha$—$Cr_{100\,at\,\%-\alpha}$ films were formed by co-sputtering, provides a higher Hex as compared to Reference Example 2, in which $Pt_\alpha$—$Cr_{100\,at\,\%-\alpha}$ films were formed by alternate stacking, within the Pt percentage range of 51 at % to 57 at %.

Base Layer

Figure 14:
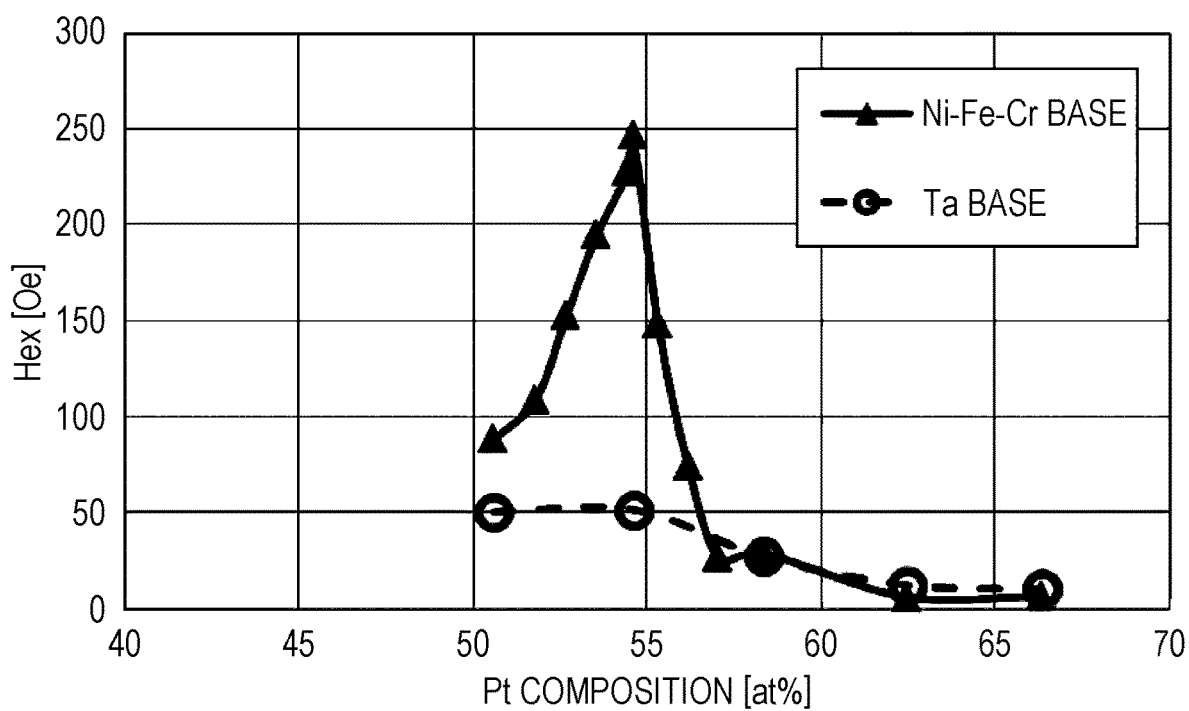
FIG. 14 is a graph showing the relationship between the percentage of Pt contained in Pt—Cr prepared in each of Reference Example 1 and Reference Example 3 and the Hex.

FIG. 14 is a graph showing the relationship between the percentage of Pt contained in Pt—Cr prepared in each of Reference Example 1 and Reference Example 3 and the Hex. As is clear from this figure, exchange-coupled films Reference Example 1 (Ni—Fe—Cr base) exhibits a significantly higher Hex as compared to Reference Example 3 (Ta base) within the Pt percentage range of 51 at % to 57 at %.

Example 9

Figure 15:
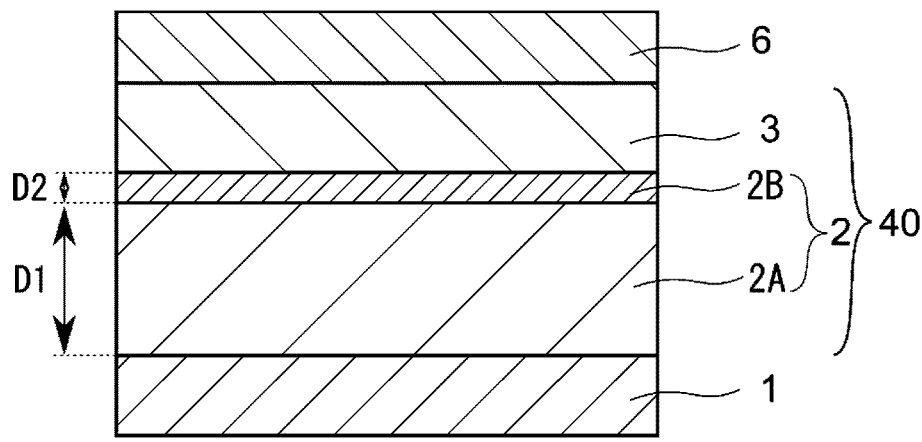
FIG. 15 is an illustration showing the film configuration of an exchange-coupled film prepared in each of Examples 9 to 12 and Comparative Examples 3 and 4.

In order to investigate the relationship between the temperature and the Hex, an exchange-coupled film 40 having a structure shown in FIG. 15 was prepared.

Substrate/base layer 1: Ni—Fe—Cr (42)/antiferromagnetic layer 2/pinned magnetic layer 3: 90Co—Fe (100)/protective layer 6: Ta (90)

The exchange-coupled film 40 was formed by setting an antiferromagnetic layer 2 to 51Pt—Cr (280)/Pt—Mn (20) and was annealed at 350° C. for 5 hours in a magnetic field of 1 kOe such that the magnetization of each of a pinned magnetic layer 3 and the antiferromagnetic layer 2 was pinned.

Comparative Example 3

An exchange-coupled film 40 was formed by setting an antiferromagnetic layer 2 to 51Pt—Cr (300) and was annealed at 350° C. for 5 hours in a magnetic field of 1 kOe such that the magnetization of each of a pinned magnetic layer 3 and the antiferromagnetic layer 2 was pinned.

Table 5 shows results obtained by measuring the exchange-coupled film 40 prepared in each of Example 9 and Comparative Example 3 for a change in Hex due to a change in temperature. In Tables 5 to 7, Tb represents the temperature at which the Hex vanishes and Hex (200° C. or 300° C.)/Hex (room temperature) represents a normalized value obtained by dividing the Hex at 200° C. or 300° C. by the Hex at room temperature.

TABLE 5

| Thickness of 51Pt—Cr sublayer D1 [Å] | Thickness of Pt—Mn sublayer D2 [Å] | Tb (° C.) | Hex (200° C.)/ Hex (room temperature) | Hex (300° C.)/ Hex (room temperature) |
|---|---|---|---|---|
| 300 | 0 | 460 | 0.96 | 0.66 |
| 280 | 20 | >500 | 0.88 | 0.75 |

Example 10

An exchange-coupled film 40 was formed by setting an antiferromagnetic layer 2 to 51Pt—Cr (280)/Pt—Mn (20) and was annealed at 400° C. for 5 hours in a magnetic field of 1 kOe such that the magnetization of each of a pinned magnetic layer 3 and the antiferromagnetic layer 2 was pinned.

Comparative Example 4

An exchange-coupled film 40 was formed by setting an antiferromagnetic layer 2 to Pt—Mn (300) and was annealed at 400° C. for 5 hours in a magnetic field of 1 kOe such that the magnetization of each of a pinned magnetic layer 3 and the antiferromagnetic layer 2 was pinned.

Table 6 shows measurement result of Example 10 and Comparative Example 4.

TABLE 6

| Thickness of 51Pt—Cr sublayer D1 [Å] | Thickness of Pt—Mn sublayer D2 [Å] | Tb (° C.) | Hex (200° C.)/ Hex (room temperature) | Hex (300° C.)/ Hex (room temperature) |
|---|---|---|---|---|
| 280 | 20 | >500 | 0.86 | 0.76 |
| 0 | 300 | 400 | 0.82 | 0.35 |

Example 11

An exchange-coupled film 40 was formed by setting an antiferromagnetic layer 2 to 54Pt—Cr (290)/Pt—Mn (10) and was annealed at 400° C. for 5 hours in a magnetic field of 1 kOe such that the magnetization of each of a pinned magnetic layer 3 and the antiferromagnetic layer 2 was pinned.

Example 12

An exchange-coupled film 40 was formed by setting an antiferromagnetic layer 2 to 54Pt—Cr (280)/Pt—Mn (20) and was annealed at 400° C. for 5 hours in a magnetic field of 1 kOe such that the magnetization of each of a pinned magnetic layer 3 and the antiferromagnetic layer 2 was pinned.

Table 7 shows measurement result of Examples 11 and 12 and Comparative Example 4.

TABLE 7

| Thickness of 54Pt—Cr sublayer D1 [Å] | Thickness of Pt—Mn sublayer D2 [Å] | Tb (° C.) | Hex (200° C.)/ Hex (room temperature) | Hex (300° C.)/ Hex (room temperature) |
|---|---|---|---|---|
| 290 | 10 | 500 | 0.98 | 0.86 |
| 280 | 20 | >500 | 0.91 | 0.80 |
| 0 | 300 | 400 | 0.82 | 0.35 |

Figure 16:
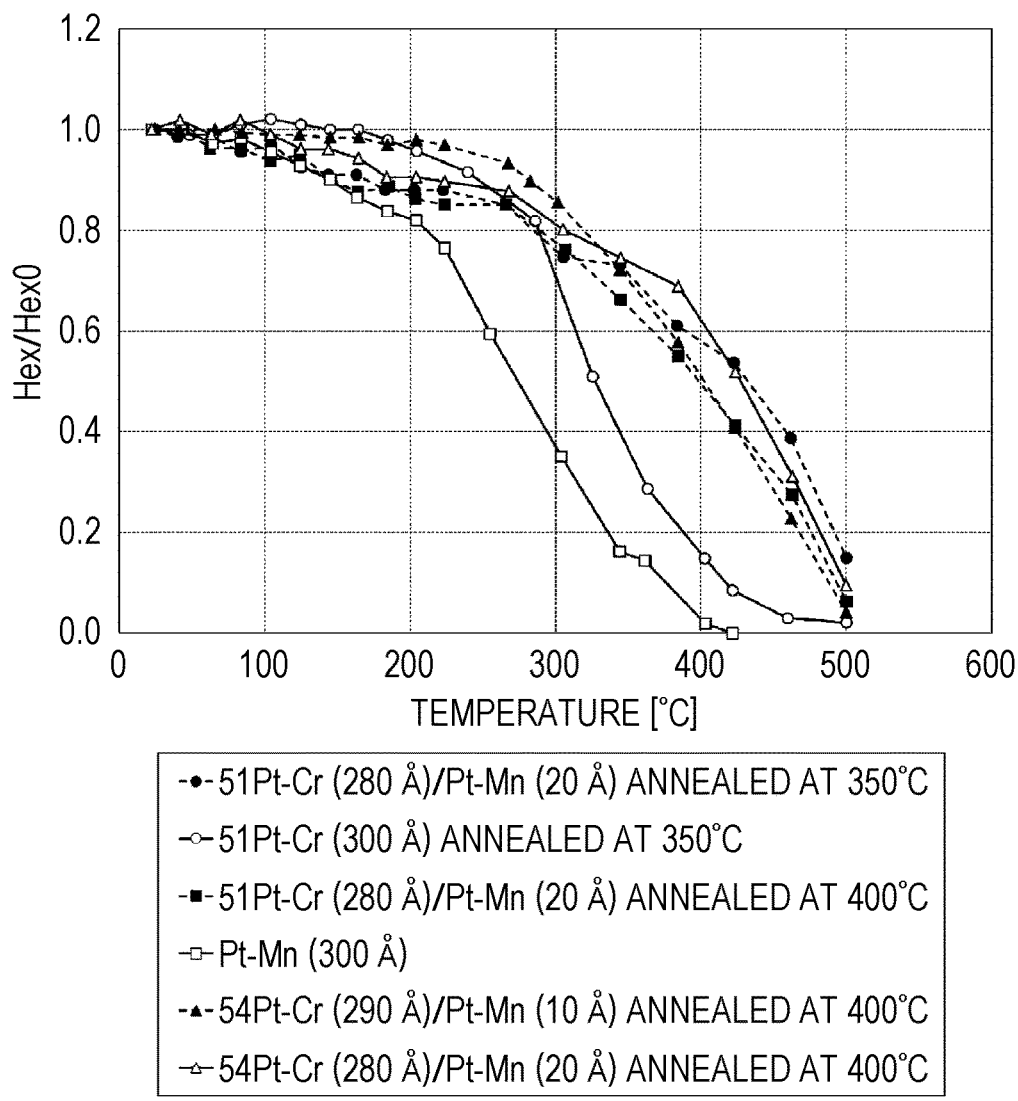
FIG. 16 is a graph showing the relationship between the temperature of an exchange-coupled film prepared in each of Examples 9 to 12 and Comparative Examples 3 and 4 and the Hex.

FIG. 16 is a graph showing the relationship between the temperature of the exchange-coupled film 40 prepared in each of Examples 9 to 12 and Comparative Examples 3 and 4 and the Hex. This graph shows results obtained by measuring the quantity corresponding to the Hex in the R-H curve of each of FIGS. 5 to 7 using a VSM (vibrating sample magnetometer). As shown in FIG. 16 and Tables 5 to 7, an exchange-coupled film 40 including an antiferromagnetic layer 2 including a Pt—Mn sublayer and a Pt—Cr sublayer inserted therein exhibited higher Tb as compared to an exchange-coupled film including an antiferromagnetic layer 2 made of Pt—Mn only and also exhibited high stability under high-temperature conditions for maintaining high Hex.

Example 13

Magnetic sensing elements 11 (refer to FIG. 1) each including an exchange-coupled film 10 having a film configuration below were prepared. The exchange-coupled film 10 was annealed at 350° C. for 5 hours in a magnetic field of 1 kOe, whereby the magnetization of each of a pinned magnetic layer 3 and an antiferromagnetic layer 2 was pinned.

Substrate/base layer 1: Ni—Fe—Cr (40)/antiferromagnetic layer 2 [Pt—Cr sublayer 2A: $Pt_\alpha$—$Cr_{100\ at\ \%-\alpha}$ (280)/X—Mn sublayer 2B: $Pt_{48\ at\ \%}$—$Mn_{52\ at\ \%}$ (20)]/pinned magnetic layer 3: $Co_{90\ at\ \%}$—$Fe_{10at\ \%}$ (50)/nonmagnetic material layer 4: Cu (50)/free magnetic layer 5: [$Co_{90\ at\ \%}$—$Fe_{10\ at\ \%}$ (15)/$Ni_{81.5\ at\ \%}$—$Fe_{18.5\ at\ \%}$ (30)]/protective layer 6: Ta (50)

The Pt content α of each Pt—Cr sublayer 2A was varied within the range of 46.2 at % to 57.5 at %. For each of the obtained exchange-coupled films 10 (Examples 13-1 to 13-11), the Hex calculated from an R-H curve was shown in Table 8.

Example 14

Magnetic sensing elements 11 (refer to FIG. 1) each including an exchange-coupled film 10 having the same film configuration as that described in Example 13 were prepared in such a manner that annealing was performed under substantially the same conditions as those described in Example 13 such that the magnetization of each of a pinned magnetic layer 3 and an antiferromagnetic layer 2 was pinned except that the annealing temperature was 400° C. For each of the obtained exchange-coupled films 10 (Examples 14-1 to 14-11), the Hex calculated from an R-H curve was shown in Table 8.

TABLE 8

| | Content of Pt in film (at %) | Exchange coupling field (Oe) |
|---|---|---|
| Example 13-1 | 46.2 | 52 |
| Example 13-2 | 47.3 | 59 |
| Example 13-3 | 48.4 | 284 |
| Example 13-4 | 49.5 | 709 |
| Example 13-5 | 50.7 | 831 |
| Example 13-6 | 51.8 | 813 |
| Example 13-7 | 52.9 | 736 |
| Example 13-8 | 54.1 | 446 |
| Example 13-9 | 55.2 | 107 |
| Example 13-10 | 56.3 | 59 |
| Example 13-11 | 57.5 | 51 |
| Example 14-1 | 46.2 | 761 |
| Example 14-2 | 47.3 | 828 |
| Example 14-3 | 48.4 | 865 |
| Example 14-4 | 49.5 | 906 |
| Example 14-5 | 50.7 | 976 |
| Example 14-6 | 51.8 | 1064 |
| Example 14-7 | 52.9 | 1164 |
| Example 14-8 | 54.1 | 1289 |
| Example 14-9 | 55.2 | 1245 |
| Example 14-10 | 56.3 | 827 |
| Example 14-11 | 57.5 | 266 |

Example 15

Magnetic sensing elements 21 (refer to FIG. 2) each including an exchange-coupled film 20 having a film configuration below were prepared. The exchange-coupled film 20 was annealed at 350° C. for 5 hours in a magnetic field of 1 kOe, whereby the magnetization of each of a pinned magnetic layer 3 and an antiferromagnetic layer 2 was pinned.

Substrate/base layer 1: Ni—Fe—Cr (40)/free magnetic layer 5: [$Ni_{81.5\ at\ \%}$—$Fe_{18.5\ at\ \%}$ (30)/$Co_{90\ at\ \%}$—$Fe_{10\ at\ \%}$ (15)]/nonmagnetic material layer 4: Cu (50)/pinned magnetic layer 3: $Co_{90\ at\ \%}$—$Fe_{10\ at\ \%}$ (50)/antiferromagnetic layer 2 [X—Mn sublayer 2B: $Pt_{48\ at\ \%}$—$Mn_{52\ at\ \%}$ (20)/Pt—Cr sublayer 2A: $Pt_\alpha Cr_{100\ at\ \%-\alpha}$ (280)]/protective layer 6: Ta (50)

In this example, the pinned magnetic layer 3 of each magnetic sensing element 21 had a single-layer structure as described above. The Pt content α of the Pt—Cr sublayer 2A was varied within the range of 46.2 at % to 57.5 at %. For each of the obtained exchange-coupled films 20 (Examples 15-1 to 15-11), the Hex calculated from an R-H curve was shown in Table 9.

Example 16

Magnetic sensing elements 21 (refer to FIG. 2) each including an exchange-coupled film 20 having the same film configuration as that described in Example 15 were prepared in such a manner that annealing was performed under substantially the same conditions as those described in Example 15 such that the magnetization of each of a pinned magnetic layer 3 and an antiferromagnetic layer 2 was pinned except that the annealing temperature was 400° C. For each of the obtained exchange-coupled films 20 (Examples 16-1 to 16-11), the Hex calculated from an R-H curve was shown in Table 9.

TABLE 9

| | Content of Pt in film (at %) | Exchange coupling field (Oe) |
|---|---|---|
| Example 15-1 | 46.2 | 66 |
| Example 15-2 | 47.3 | 376 |
| Example 15-3 | 48.4 | 722 |
| Example 15-4 | 49.5 | 831 |
| Example 15-5 | 50.7 | 885 |
| Example 15-6 | 51.8 | 815 |
| Example 15-7 | 52.9 | 714 |
| Example 15-8 | 54.1 | 427 |
| Example 15-9 | 55.2 | 161 |
| Example 15-10 | 56.3 | 60 |
| Example 15-11 | 57.5 | 52 |
| Example 16-1 | 46.2 | 660 |
| Example 16-2 | 47.3 | 789 |
| Example 16-3 | 48.4 | 909 |
| Example 16-4 | 49.5 | 997 |
| Example 16-5 | 50.7 | 1057 |
| Example 16-6 | 51.8 | 1040 |
| Example 16-7 | 52.9 | 1006 |
| Example 16-8 | 54.1 | 909 |
| Example 16-9 | 55.2 | 789 |
| Example 16-10 | 56.3 | 617 |
| Example 16-11 | 57.5 | 94 |

Comparative Example 5

A magnetic sensing element 21 having substantially the same film configuration as that described in Example 15 was prepared under the same annealing conditions as those described in Example 15 except that an antiferromagnetic layer 2 was composed of a sublayer having the composition $Ir_{20\ at\ \%}Mn_{80\ at\ \%}$ and a thickness of 80 Å. The Hex calculated from the R-H curve of an obtained exchange-coupled film 20 was 196 Oe.

Comparative Example 6

A magnetic sensing element 21 having substantially the same film configuration as that described in Example 16 was prepared under the same annealing conditions as those described in Example 16 except that an antiferromagnetic layer 2 was composed of a sublayer having the composition $Ir_{20\ at\ \%}Mn_{80\ at\ \%}$ and a thickness of 80 Å. The Hex calculated from the R-H curve of an obtained exchange-coupled film 20 was 175 Oe.

Comparative Example 7

A magnetic sensing element 21 having substantially the same film configuration as that described in Example 15 was prepared under the same annealing conditions as those described in Example 15 except that an antiferromagnetic layer 2 was composed of a sublayer having the composition $Pt_{48\ at\ \%}Mn_{52\ at\ \%}$ and a thickness of 300 Å. The Hex calculated from the R-H curve of an obtained exchange-coupled film 20 was 570 Oe.

Comparative Example 8

A magnetic sensing element 21 having substantially the same film configuration as that described in Example 16 was prepared under the same annealing conditions as those described in Example 16 except that an antiferromagnetic layer 2 was composed of a sublayer having the composition $Pt_{48\ at\ \%}Mn_{52\ at\ \%}$ and a thickness of 300 Å. The Hex calculated from the R-H curve of an obtained exchange-coupled film 20 was 574 Oe.

Figure 17:
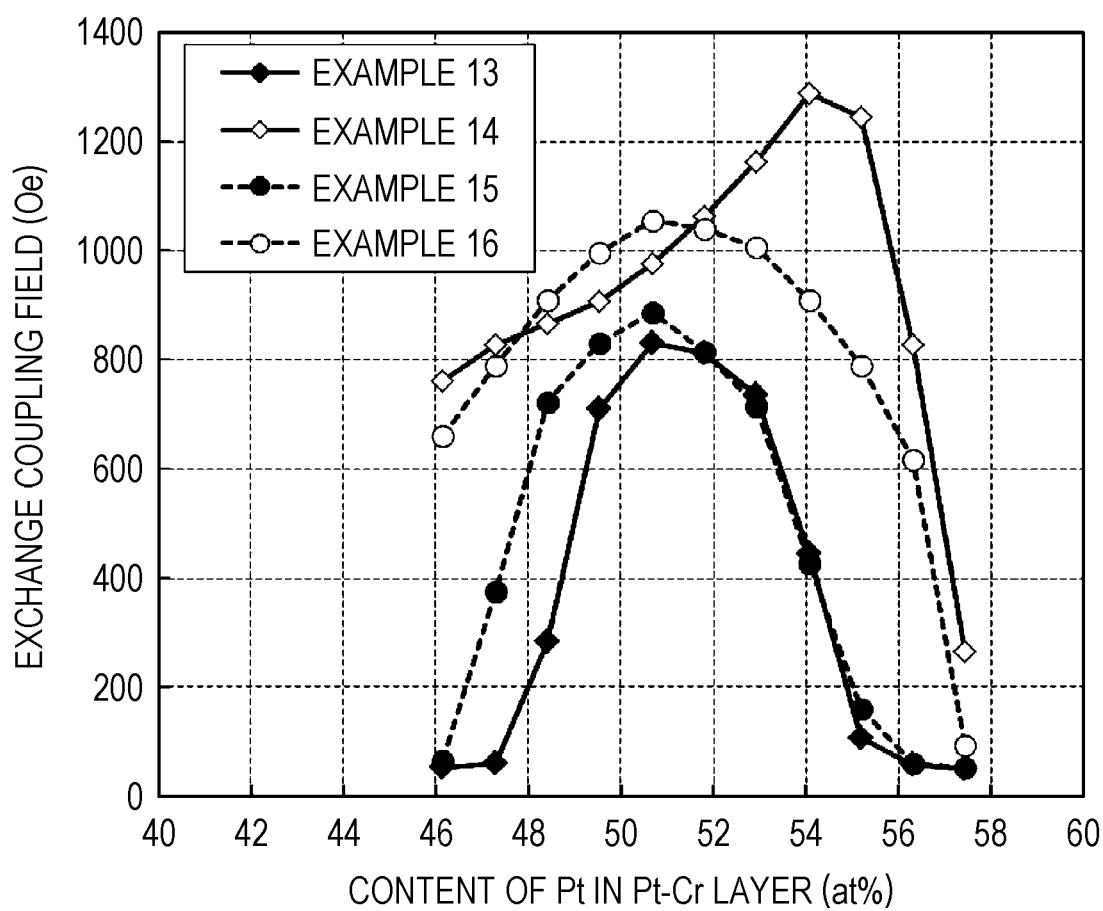
FIG. 17 is a graph showing the relationship between the content of Pt in a Pt—Cr sublayer of each of exchange-coupled films prepared in Examples 13 to 16 and the Hex.

Results of Examples 13 to 16 were shown in FIG. 17. It was recognized that, for the exchange-coupled film 20 having a configuration in which the Pt—Mn sublayer 2B was placed on the pinned magnetic layer 3 and the Pt—Cr sublayer 2A was placed thereon (Examples 15 and 16), an exchange coupling field Hex tended to peak in the vicinity of where the Pt content of the Pt—Cr sublayer 2A was 50 at %, that is, in the vicinity of where the atomic ratio of Pt/Cr was 1 and tended to decrease as the ratio P/Cr shifted from 1 as shown in FIG. 7. This tendency was substantially equal between the case where the content of Pt was relatively high (a right side in FIG. 17) and the case where the content of Pt was relatively low (a left side in FIG. 17). This tendency was substantially equally recognized between the case where the annealing temperature was 350° C. (Example 15) and the case where the annealing temperature was 400° C. (Example 16).

However, for the exchange-coupled film 10 having a configuration in which the Pt—Mn sublayer 2B was placed on the Pt—Cr sublayer 2A and the pinned magnetic layer 3 was placed thereon (Examples 13 and 14), in both of the case where the annealing temperature was 350° C. (Example 13) and the case where the annealing temperature was 400° C. (Example 14), an exchange coupling field Hex peaked at a composition in which the Pt content of the Pt—Cr sublayer 2A was higher than 50 at %, that is, a composition in which the atomic ratio of Pt/Cr was higher than 1. The tendency that the peak of the Hex offset was recognized more significantly in the case where the annealing temperature was 400° C. (Example 14) than in the case where the annealing temperature was 350° C. (Example 13).

These results possibly suggest items below.

When the annealing temperature is 350° C. (Examples 13 and 15), the degree of the lattice rearrangement of each of a Pt—Cr sublayer 2A and a Pt—Mn sublayer 2B is low; however, when the annealing temperature is 400° C. (Examples 14 and 16), the degree of the lattice rearrangement thereof is high.

In the case where a Pt—Mn sublayer 2B is formed on a pinned magnetic layer 3 (Examples 15 and 16), the Pt—Mn sublayer 2B is formed so as to have a small lattice strain and therefore an unbiased peak centered at Pt/Cr=1 where the Hex theoretically peaks is obtained for the composition tendency of the Hex.

In the case where a Pt—Mn sublayer 2B is formed on a Pt—Cr sublayer 2A (Examples 13 and 14), the Pt—Mn sublayer 2B is formed so as to follow the lattice of the Pt—Cr sublayer 2A and therefore the lattice of the Pt—Mn sublayer 2B is in a strained state.

Under such conditions that the annealing temperature is 350° C. and the rearrangement of a lattice is not sufficiently induced (Example 13), when the content of Pt is low, the influence of a lattice strain is significant, a Pt—Mn sublayer 2B is unlikely to have an $L_{10}$ ordered structure, and a reduction in Hex is significant.

Under such conditions that the annealing temperature is 400° C. and the rearrangement of a lattice is sufficiently induced, Pt much contained in a Pt—Cr sublayer 2A reduces the lattice mismatch between a Pt—Mn sublayer 2B and the Pt—Cr sublayer 2A and therefore the Pt—Mn sublayer 2B on the Pt—Cr sublayer 2A is likely to have an $L_{10}$ ordered structure. The effect of reducing the lattice mismatch therebetween increases as the content of Pt increases. Therefore, in Example 14, the Hex increases monotonically (in proportion to the content of Pt) until Pt reaches 54 at %.

However, when the Pt content of the Pt—Cr sublayer 2A is 55 at % or more, an $L_{10}$ ordered structure is unlikely to be formed in the Pt—Cr sublayer 2A, resulting in a significant reduction in Hex.

What is claimed is:

1. An exchange-coupled film comprising
an antiferromagnetic layer composed of a Pt—Cr sublayer and an X—Mn sublayer (where X is Pt or Ir); and
a pinned magnetic layer, the antiferromagnetic layer and the pinned magnetic layer being stacked,
wherein the X—Mn sublayer is in contact with the pinned magnetic layer, and the Pt—Cr sublayer has a composition represented by the formula $Pt_\alpha Cr_{100\ at\ \%-\alpha}$ (α is 44 at % to 58 at %) when the X—Mn sublayer is placed on the Pt—Cr sublayer or has a composition represented by the formula $Pt_\alpha Cr_{100\ at\ \%-\alpha}$ (α is 44 at % to 57 at %) when the X—Mn sublayer is placed on the pinned magnetic layer.

2. The exchange-coupled film according to claim 1, wherein the pinned magnetic layer is a self-pinned layer including a first magnetic sublayer, intermediate sublayer, and second magnetic sublayer which are stacked.

3. The exchange-coupled film according to claim 1, wherein the thickness of the Pt—Cr sublayer is greater than the thickness of the X—Mn sublayer.

4. The exchange-coupled film according to claim 3, wherein the ratio of the thickness of the Pt—Cr sublayer to the thickness of the X—Mn sublayer is 5:1 to 100:1.

5. The exchange-coupled film according to claim 1, wherein the Pt—Cr sublayer has a composition represented by the formula $Pt_\alpha Cr_{100\ at\ \%-\alpha}$ (α is 45 at % to 57 at %) when the X—Mn sublayer is placed on the Pt—Cr sublayer or has a composition represented by the formula $Pt_\alpha Cr_{100\ at\ \%-\alpha}$ ($\alpha$ is 45 at % to 56 at %) when the X—Mn sublayer is placed on the pinned magnetic layer.

6. The exchange-coupled film according to claim 1, wherein the Pt—Cr sublayer has a composition represented by the formula $Pt_\alpha Cr_{100\ at\ \%-\alpha}$ ($\alpha$ is 48 at % to 55 at %) when the X—Mn sublayer is placed on the Pt—Cr sublayer or has a composition represented by the formula $Pt_\alpha Cr_{100\ at\ \%-\alpha}$ ($\alpha$ is 47 at % to 55 at %) when the X—Mn sublayer is placed on the pinned magnetic layer.

7. The exchange-coupled film according to claim 1, further comprising a base layer next to the antiferromagnetic layer, wherein the base layer is made of Ni—Fe—Cr.

8. A magnetoresistive element comprising the exchange-coupled film according to claim 1 and a free magnetic layer, the exchange-coupled film and the free magnetic layer being stacked.

9. A magnetic sensing device comprising the magnetoresistive element according to claim 8.

10. The magnetic sensing device according to claim 9, further comprising a plurality of magnetoresistive elements, placed on a single substrate, identical to the magnetoresistive element according to claim 8, wherein a plurality of the magnetoresistive elements include those having different pinned magnetization directions.

11. A method for manufacturing an exchange-coupled film including an antiferromagnetic layer and pinned magnetic layer which are stacked, the antiferromagnetic layer being composed of a Pt—Cr sublayer and an X—Mn sublayer (where X is Pt or Ir), the X—Mn sublayer being in contact with the pinned magnetic layer, the method comprising:

forming the Pt—Cr sublayer such that the Pt—Cr sublayer has a composition represented by the formula $Pt_\alpha Cr_{100\ at\ \%-\alpha}$ ($\alpha$ is 44 at % to 58 at %) in the case where the X—Mn sublayer is stacked on the Pt—Cr sublayer or forming the Pt—Cr sublayer such that the Pt—Cr sublayer has a composition represented by the formula $Pt_\alpha Cr_{100\ at\ \%-\alpha}$ ($\alpha$ is 44 at % to 57 at %) in the case where the X—Mn sublayer is stacked on the pinned magnetic layer.

* * * * *